(12) United States Patent
Sato et al.

(10) Patent No.: US 7,255,579 B2
(45) Date of Patent: Aug. 14, 2007

(54) ANISOTROPIC CONDUCTIVE CONNECTOR AND CIRCUIT-DEVICE ELECTRICAL-INSPECTION DEVICE

(75) Inventors: Katsumi Sato, Tokyo (JP); Kazuo Inoue, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/552,995

(22) PCT Filed: Apr. 5, 2004

(86) PCT No.: PCT/JP2004/004891

§ 371 (c)(1),
(2), (4) Date: Oct. 13, 2005

(87) PCT Pub. No.: WO2004/093254

PCT Pub. Date: Oct. 28, 2004

(65) Prior Publication Data

US 2006/0199405 A1     Sep. 7, 2006

(30) Foreign Application Priority Data

Apr. 16, 2003  (JP) .............................. 2003-111225

(51) Int. Cl.
   *H01R 4/58* (2006.01)
(52) U.S. Cl. ....................................................... 439/91
(58) Field of Classification Search .................. 439/91, 439/66, 63, 591
   See application file for complete search history.

(56) References Cited

U.S. PATENT DOCUMENTS

| | | | | |
|---|---|---|---|---|
| 4,209,481 A | * | 6/1980 | Kashiro et al. | ............. 264/437 |
| 4,720,770 A | * | 1/1988 | Jameson | ...................... 361/705 |
| 6,168,442 B1 | * | 1/2001 | Naoi | ............................ 439/91 |
| 6,184,460 B1 | * | 2/2001 | Bertoncini | .................. 174/359 |
| 6,206,729 B1 | * | 3/2001 | Bradley et al. | ............. 439/608 |

(Continued)

FOREIGN PATENT DOCUMENTS

| | | |
|---|---|---|
| JP | 5-55553 | 7/1993 |
| JP | 7-321490 | 12/1995 |
| JP | 2001-76541 | 3/2001 |
| JP | 2002-5991 | 1/2002 |
| JP | 2003-77962 | 3/2003 |

OTHER PUBLICATIONS

U.S. Appl. No. 10/560,347, filed Dec. 12, 2005, Yamada et al.

(Continued)

*Primary Examiner*—Tulsidas C. Patel
*Assistant Examiner*—Vladimir Imas
(74) *Attorney, Agent, or Firm*—Oblon, Spivak, McClelland, Maier & Neustadt, P.C.

(57) ABSTRACT

An anisotropically conductive connector, by which expected electrical inspection can be conducted even to a circuit device having a clock frequency of, for example, at least 1 GHz, and an electrical inspection apparatus for circuit devices, which is equipped with this connector. The anisotropically conductive connector includes an elastic anisotropically conductive film having a plurality of conductive parts for connection arranged in accordance with a pattern corresponding to electrodes to be connected and extending in a thickness-wise direction of the film and an insulating part mutually insulating these conductive parts for connection, wherein conductive parts for high-frequency shielding extending in the thickness-wise direction are formed in the elastic anisotropically conductive film. The electrical inspection apparatus for circuit devices includes the above anisotropically conductive connector.

14 Claims, 20 Drawing Sheets

U.S. PATENT DOCUMENTS

| | | | |
|---|---|---|---|
| 6,210,227 B1* | 4/2001 | Yamasaki et al. | 439/608 |
| 6,245,175 B1* | 6/2001 | Hotta et al. | 156/172 |
| 6,394,821 B1* | 5/2002 | Matsumura et al. | 439/91 |
| 6,663,799 B2 | 12/2003 | Kokubo et al. | |
| 6,690,564 B1 | 2/2004 | Haruta et al. | |
| 6,870,385 B2 | 3/2005 | Inoue et al. | |
| 6,969,622 B1 | 11/2005 | Kokubo et al. | |
| 2001/0016435 A1* | 8/2001 | Fujimura | 439/66 |
| 2001/0049208 A1* | 12/2001 | Igarashi et al. | 439/68 |
| 2002/0111055 A1* | 8/2002 | Matsumura et al. | 439/91 |
| 2005/0106907 A1 | 5/2005 | Yamada et al. | |
| 2005/0245133 A1* | 11/2005 | Scherer et al. | 439/610 |
| 2005/0272282 A1 | 12/2005 | Setaka et al. | |

OTHER PUBLICATIONS

U.S. Appl. No. 10/523,195, filed Jan. 27, 2005, Setaka.
U.S. Appl. No. 10/522,537, filed Jan. 27, 2005, Setaka et al.
U.S. Appl. No. 10/525,089, filed Feb. 23, 2005, Inoue et al.
U.S. Appl. No. 10/548,832, filed Sep. 13, 2005, Igarashi et al.
U.S. Appl. No. 10/559,846, filed Dec. 7, 2005, Igarashi et al.

* cited by examiner

ANISOTROPIC CONDUCTIVE CONNECTOR AND CIRCUIT-DEVICE ELECTRICAL-INSPECTION DEVICE

TECHNICAL FIELD

The present invention relates to an anisotropically conductive connector and an electrical inspection apparatus for circuit devices, which is equipped with this anisotropically conductive connector, and more particularly to an anisotropically conductive connector and an electrical inspection apparatus for circuit devices, which are suitable for use in electrical inspection of a circuit device having a clock frequency of, for example, at least 1 GHz.

BACKGROUND ART

An anisotropically conductive elastomer sheet is a sheet exhibiting conductivity only in its thickness-wise direction or having pressure-sensitive conductive conductor parts exhibiting conductivity only in the thickness-wise direction when they are pressurized in the thickness-wise direction. As such anisotropically conductive elastomer sheets, there have heretofore been known those of various structures.

As anisotropically conductive elastomer sheets exhibiting conductivity only in the thickness-wise direction in a non-pressurized state, there have been known, for example, those obtained by arranging conductive fiber in a sheet substrate composed of insulating rubber in a state oriented so as to extend in the thickness-wise direction, and those (see, for example, the following Prior Art. 1) obtained by alternately laminating conductive rubber with carbon black or metal powder incorporated therein and insulating rubber in a plane direction thereof.

On the other hand, as anisotropically conductive elastomer sheets exhibiting conductivity only in the thickness-wise direction when they are pressurized in the thickness-wise direction, there have been known those (see, for example, the following Prior Art. 2) obtained by uniformly dispersing metal particles in an elastomer, those (see, for example, the following Prior Art. 3) obtained by unevenly distributing particles of a conductive magnetic substance in an elastomer, thereby forming a great number of conductive parts each extending in a thickness-wise direction thereof and an insulating part mutually insulating them and those (see, for example, the following Prior Art. 4) obtained by defining a difference in level between the surface of each conductive part and an insulating part.

Since such an anisotropically conductive elastomer sheet has such features that compact electrical connection can be achieved without using any means such as soldering or mechanical fitting, and that soft connection is feasible with mechanical shock or strain absorbed therein, it is widely used as a connector for achieving electrical connection between a circuit device, for example, a printed circuit board, and a leadless chip carrier, liquid crystal panel or the like in fields of, for example, electronic computers, electronic digital clocks, electronic cameras and computer key boards.

On the other hand, in electrical inspection of circuit devices such as semiconductor integrated circuit devices such as packaged IC and MCM, wafers, on which integrated circuits have been formed, and printed circuit boards, an anisotropically conductive elastomer sheet is used as a connector for achieving electrical connection between electrodes to be inspected formed on one surface of a circuit device, which is an object of inspection, and inspection electrodes formed on the surface of a circuit board for inspection.

In this electrical inspection of the circuit device, a test of direct current characteristics for measuring a source current, input-output voltage, input-output current and the like in the circuit device, a test of alternating current characteristics for measuring a propagation delay time between input and output terminals, transition time of an output waveform, maximum clock frequency and the like in the circuit device, or the like is conducted.

With the demand for speeding-up of processing in an electronic apparatus such as a computer, in resent years, a device having a high clock frequency has been used as a circuit device such as CPU installed in the electronic apparatus. In order to conduct the expected test of alternating current characteristics without causing a misfunction in electrical inspection of such a circuit device, it is important to sufficiently control noises to high-frequency signals.

As a means for controlling the noises to the high-frequency signals in an anisotropically conductive elastomer sheet used in the electrical inspection of the circuit device, there has been proposed a means for supporting the anisotropically conductive elastomer sheet by a frame plate having conductivity and connecting the frame plate to a ground (see, for example, the following Prior Art. 5 and Prior Art. 6).

However, according to such a means, it is difficult to sufficiently control the noises to the high-frequency signals when electrical inspection is conducted as to a circuit device having a clock frequency of, for example, at least 1 GHz.

Prior Art. 1: Japanese Patent Application Laid-Open No. 94495/1975;

Prior Art. 2: Japanese Patent Application Laid-Open No. 93393/1976;

Prior Art. 3: Japanese Patent Application Laid-Open No. 147772/1978;

Prior Art. 4: Japanese Patent Application Laid-Open No. 250906/1986;

Prior Art. 5: Japanese Patent Application Laid-Open No. 2000-164041;

Patent Art. 6: Japanese Patent Application Laid-Open No. 2002-33358.

DISCLOSURE OF THE INVENTION

The present invention has been made on the basis of the foregoing circumstances and has as its first object the provision of an anisotropically conductive connector, by which expected electrical inspection can be conducted even to a circuit device having a clock frequency of, for example, at least 1 GHz.

A second object of the present invention is to provide an electrical inspection apparatus for circuit devices, by which expected electrical inspection can be conducted even to a circuit device having a clock frequency of, for example, at least 1 GHz.

According to the present invention, there is provided an anisotropically conductive connector comprising an elastic anisotropically conductive film having a plurality of conductive parts for connection arranged in accordance with a pattern corresponding to electrodes to be connected and extending in a thickness-wise direction of the film and an insulating part mutually insulating these conductive parts for connection, Wherein a conductive part for high-frequency shielding extending in the thickness-wise direction is formed in the elastic anisotropically conductive film.

According to the present invention, there is also provided an anisotropically conductive connector comprising an elastic anisotropically conductive film having a plurality of conductive parts for connection arranged in accordance with a pattern corresponding to electrodes to be connected and extending in a thickness-wise direction of the film and an insulating part mutually insulating these conductive parts for connection, wherein conductive parts for high-frequency shielding arranged so as to surround the each of conductive parts for connection and extending in the thickness-wise direction are formed in the elastic anisotropically conductive film.

According to the present invention, there is further provided an anisotropically conductive connector comprising an elastic anisotropically conductive film having a plurality of conductive parts for connection arranged in accordance with a pattern corresponding to electrodes to be connected and extending in a thickness-wise direction of the film and an insulating part mutually insulating these conductive parts for connection, wherein a conductive part for high-frequency shielding arranged so as to surround a group of conductive parts including the plurality of the conductive parts for connection and extending in the thickness-wise direction is formed in the elastic anisotropically conductive film.

According to the present invention, there is still further provided an anisotropically conductive connector comprising:

a frame plate having conductivity, in which a plurality of openings have been formed in accordance with a pattern corresponding to electrodes to be connected, and an elastic anisotropically conductive film composed of a plurality of functional parts arranged in the respective openings of the frame plate and composed of a conductive part for connection extending in a thickness-wise direction of the film and an insulating part formed integrally with the periphery of the conductive part, and a part to be supported, which is formed integrally with the peripheries of the functional parts and fixed to the frame plate by being laminated on the frame plate, wherein conductive parts for high-frequency shielding arranged so as to surround the each of conductive parts for connection, electrically connected to the frame plate and extending in the thickness-wise direction are formed in the part to be supported in the elastic anisotropically conductive film.

According to the present invention, there is yet still further provided an anisotropically conductive connector comprising:

a frame plate having conductivity, in which an opening extending through in a thickness-wise direction has been formed, and an elastic anisotropically conductive film arranged in the opening of the frame plate and composed of a functional part having a plurality of conductive parts for connection arranged in accordance with a pattern corresponding to electrodes to be connected and extending in the thickness-wise direction and an insulating part mutually insulating the conductive parts for connection, and a part to be supported, which is formed integrally with the periphery of the functional part and fixed to the frame plate by being laminated on the frame plate, wherein a conductive part for high-frequency shielding arranged so as to surround a group of conductive parts including the plurality of the conductive parts for connection, electrically connected to the frame plate and extending in the thickness-wise direction is formed in the part to be supported in the elastic anisotropically conductive film.

According to the present invention, there is yet still further provided an anisotropically conductive connector comprising:

a frame plate having conductivity, in which a plurality of openings have been formed in accordance with a pattern corresponding to electrodes to be connected, and an elastic anisotropically conductive film composed of a plurality of functional parts arranged in the respective openings of the frame plate and composed of a conductive part for connection extending in a thickness-wise direction of the film and an insulating part formed integrally with the periphery of the conductive part, and a part to be supported, which is formed integrally with the peripheries of the functional parts and fixed to the frame plate by being laminated on the frame plate, wherein a conductive part for high-frequency shielding arranged so as to surround a group of conductive parts including the plurality of the conductive parts for connection, electrically connected to the frame plate and extending in the thickness-wise direction is formed in the part to be supported in the elastic anisotropically conductive film.

The anisotropically conductive connectors according to the present invention may comprise cylindrical conductive parts for high-frequency shielding, wherein the cylindrical conductive part for high-frequency shielding is arranged by being each located concentrically with one conductive part for connection so as to surround the respective conductive parts for connection.

The anisotropically conductive connectors according to the present invention may have a plurality of conductive parts for high-frequency shielding for surrounding the same conductive part for connection. In such an anisotropically conductive connector, a clearance distance between conductive parts for high-frequency shielding adjoining each other, which surround the same conductive part for connection, may be preferably at most $1/10$ of a wavelength of a measurement signal.

In the anisotropically conductive connectors according to the present invention, one or more conductive parts for non-connection may be formed in addition to the conductive parts for connection in the elastic anisotropically conductive film, and the conductive parts for high-frequency shielding may be arranged so as to surround a group of conductive parts including the plurality of the conductive parts for connection and one or more conductive parts for non-connection.

The anisotropically conductive connectors according to the present invention may have a pipe-like conductive part for high-frequency shielding, wherein the pipe-like conductive part for high-frequency shielding is arranged so as to surround the group of conductive parts including the plurality of the conductive parts for connection.

The anisotropically conductive connectors may have a plurality of conductive parts for high-frequency shielding, which are arranged so as to surround the group of conductive parts including the plurality of the conductive parts for connection. In such an anisotropically conductive connector, a clearance distance between conductive parts for high-frequency shielding adjoining each other, which surround the group of conductive parts, may be preferably at most $1/10$ of a wavelength of a measurement signal.

In the anisotropically conductive connectors according to the present invention, the conductive parts for high-frequency shielding may preferably be connected to a ground.

When the anisotropically conductive connector has the conductive parts for high-frequency shielding electrically connected to the frame plate, the frame plate may preferably be connected to a ground.

According to the present invention, there is yet still further provided an electrical inspection apparatus for circuit devices, which comprises any one of the above-described anisotropically conductive connectors.

According to the present invention, there is yet still further provided an electrical inspection apparatus for circuit devices, which comprises a circuit board for inspection, on which inspection electrodes have been formed in accordance with a pattern corresponding to electrodes to be inspected of a circuit device, which is an object of inspection, and any one of the above-described anisotropically conductive connectors, which is arranged on the circuit board for inspection, wherein in the circuit board for inspection, grounding electrodes connected to a ground are formed in accordance with a pattern corresponding to the conductive parts for high-frequency shielding in the anisotropically conductive connector.

According to the present invention, there is yet still further provided an electrical inspection apparatus for circuit devices, which comprises a circuit board for inspection, on which inspection electrodes have been formed in accordance with a pattern corresponding to electrodes to be inspected of a circuit device, which is an object of inspection, and the above-described anisotropically conductive connector having the frame plate, which is arranged on the circuit board for inspection, wherein the frame plate in the anisotropically conductive connector is connected to a ground.

EFFECTS OF THE INVENTION

According to the anisotropically conductive connectors of the present invention, in addition to the conductive parts for connection electrically connected to electrodes that are an object of connection, the conductive parts for high-frequency shielding extending in the same direction as the conductive parts for connection are formed in the elastic anisotropically conductive film, so that external noises to high-frequency signals and noises from adjoining conductive parts for connection can be controlled in each of the conductive parts for connection by connecting the conductive parts for high-frequency shielding to a ground. Accordingly, in the case where the anisotropically conductive connector according to the present invention is used in the electrical inspection of a circuit device, an expected electrical inspection can be performed as to the circuit device, which is an object of inspection, without being influenced by the noises even when the clock frequency of the circuit device is, for example, at least 1 GHz.

According to the electrical inspection apparatus for circuit devices of the present invention, any one of the above-described anisotropically conductive connectors is provided, so that both external noises to high-frequency signals and noises from adjoining conductive parts for connection can be controlled in each of the conductive parts for connection by connecting the conductive parts for high-frequency shielding in the anisotropically conductive connector to a ground. Accordingly, expected electrical inspection as to a circuit device, which is an object of inspection, can be performed without being influenced by the noises even when the clock frequency of the circuit device is, for example, at least 1 GHz.

DESCRIPTION OF CHARACTERS

Figure 1:
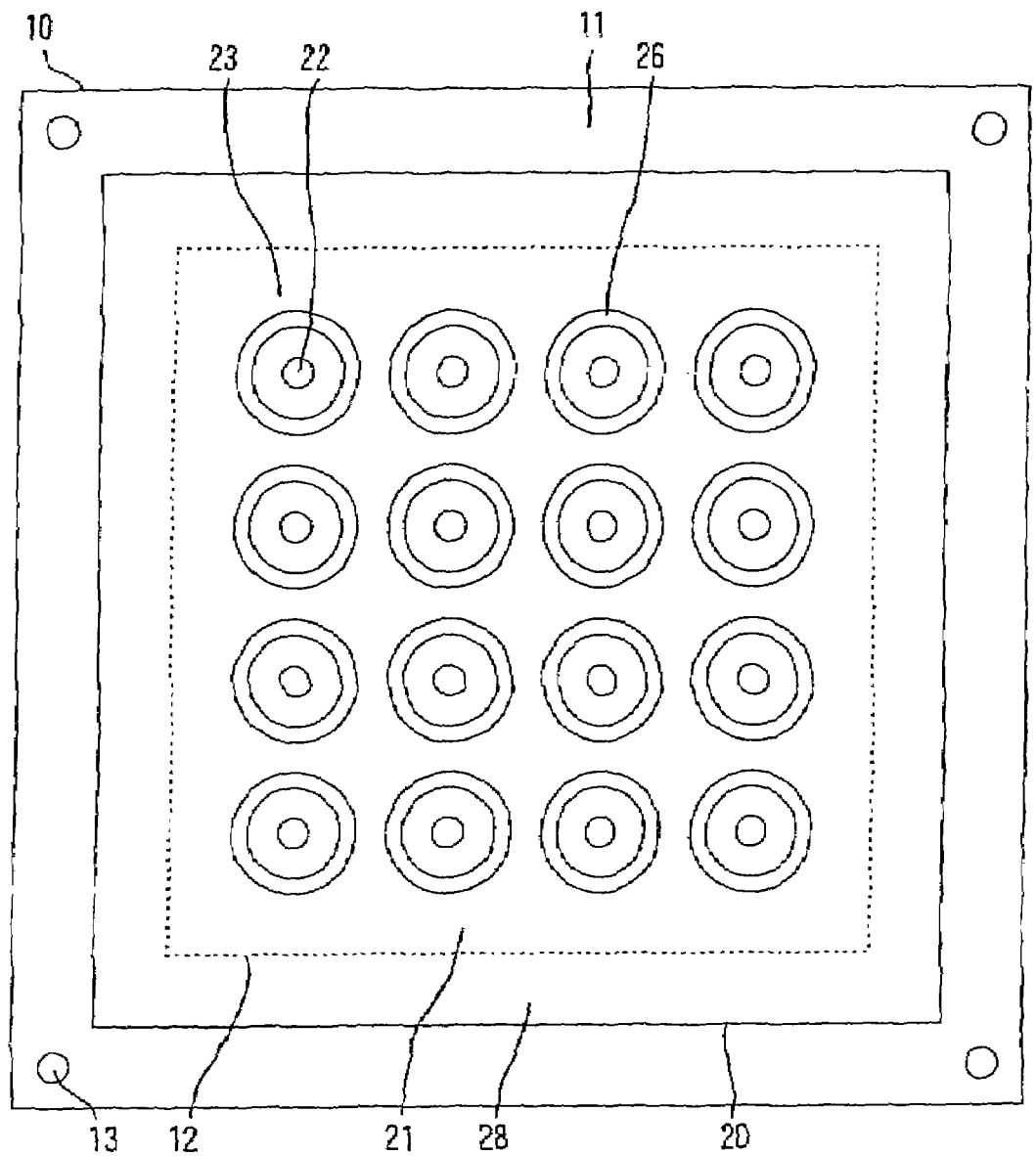
FIG. 1 is a plan view illustrating an anisotropically conductive connector according to a first embodiment of the present invention.

1 Circuit device
2 Electrodes to be inspected
10 Anisotropically conductive connector
11 Frame plate
12 Opening
13 Positioning holes
15, 16 Spacers
20 Elastic anisotropically conductive film
20A Molding material layer
21 Functional part
22 Conductive parts for connection
22a Projected parts
23 Insulating part
24 Conductive part for non-connection
25 Group of conductive parts
26, 26b, 26c Conductive parts for high-frequency shielding
26a Projected parts
28 Part to be supported
30 Top force
31 Ferromagnetic base plate
32, 33 Ferromagnetic substance layers
32a, 33a Recessed parts
34 Nonmagnetic substance layers
35 Bottom force
36 Ferromagnetic base plate
37, 38 Ferromagnetic substance layers
37a, 38a Recessed parts
39 Nonmagnetic substance layers
40 Circuit board for inspection
41 Inspection electrodes
42 Grounding electrodes
43 Guiding pins
50 Anisotropically conductive connector
51 Frame plate
52 Opening
55 Elastic anisotropically conductive film
56 Functional part
57 Conductive parts for connection
58 Insulating part
60 Top force
61 Ferromagnetic base plate
62 Ferromagnetic substance layers
63 Nonmagnetic substance layers
65 Bottom force
66 Ferromagnetic base plate
67 Ferromagnetic substance layers
68 Nonmagnetic substance layers
70, 71 Spacers
P Conductive particles.

BEST MODE FOR CARRYING OUT THE INVENTION

The embodiments of the present invention will hereinafter be described in details.

[Anisotropically Conductive Connector]

Figure 2:
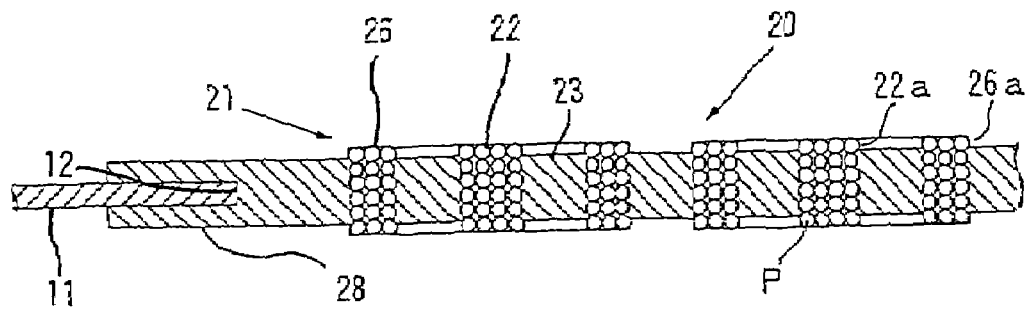
FIG. 2 is a cross-sectional view illustrating, on an enlarged scale, the construction of a principal part of the anisotropically conductive connector according to the first embodiment of the present invention.

FIG. 1 is a plan view illustrating an anisotropically conductive connector according to a first embodiment of the present invention, and FIG. 2 is a cross-sectional view illustrating, on an enlarged scale, the construction of a principal part of the anisotropically conductive connector according to the first embodiment.

The anisotropically conductive connector 10 according to the first embodiment has a frame-like frame plate 11 in the shape of a rectangle as a whole, at the center of which a rectangular opening 12 (indicated by a broken line in FIG. 1) has been formed, and a rectangular elastic anisotropically conductive film 20 having conductivity in a thickness-wise direction thereof is arranged on the opening 12 in this frame plate 11 in a state supported by an opening edge of the frame plate 11. In this embodiment, positioning holes 13 for conducting positioning to a circuit device to be connected are formed at positions of 4 corners in the frame plate 11.

The elastic anisotropically conductive film 20 is composed of an elastic polymeric substance as a base material and has a functional part 21 composed of a plurality of conductive parts 22 for connection arranged in accordance with a pattern corresponding to a pattern of electrodes of a circuit device to be connected and each extending in the thickness-wise direction, a plurality of conductive parts 26 for high-frequency shielding arranged so as to surround the respective conductive parts 22 for connection and extending in the thickness-wise direction, and an insulating part 23 mutually insulating the respective conductive parts 22 for connection and the respective conductive parts 26 for high-frequency shielding. The functional part 21 is arranged so as to be located in the opening 12 in the frame plate 11.

In this embodiment, each of the conductive parts 22 for connection has a columnar form and is arranged in accordance with positions of lattice points. Each of the conductive parts 26 for high-frequency shielding has a cylindrical form having an inner diameter greater than the diameter of the conductive part 22 for connection and is arranged by being located concentrically with one conductive part 22 for connection so as to surround the conductive part 22 for connection. Projected parts 22a and 26a protruding from other surfaces than portions, at which the conductive parts 22 for connection and the conductive parts 26 for high-frequency shielding are located, are formed at those portions on both surfaces of the functional part 21 in the elastic anisotropically conductive film 20.

At a peripheral edge of the functional part 21, a part 28 to be supported, which is fixed and supported by being laminated on an opening edge of the frame plate 11, is formed integrally and continuously with the functional part 21. More specifically, the part 28 to be supported in this embodiment is shaped in a forked form and fixed and supported in a closely contacted state so as to grasp the opening edge of the frame plate 11.

The thickness of the frame plate 11 varies according to the material thereof, but is preferably 20 to 600 µm, more preferably 40 to 400 µm.

If this thickness is less than 20 µm, the strength required upon use of the resulting anisotropically conductive connector 10 is not achieved, and the durability thereof is liable to be lowered. In addition, such stiffness as the form of the frame plate 11 is retained is not achieved, and the handling property of the anisotropically conductive connector 10 becomes low. If the thickness exceeds 600 µm on the other hand, the elastic anisotropically conductive film 20 arranged in the opening 12 becomes too great in thickness, and it may be difficult in some cases to achieve good conductivity in the conductive parts 22 for connection and necessary insulating property between the conductive part 22 for connection and the conductive part 26 for high-frequency shielding.

No particular limitation is imposed on a material for forming the frame plate 11 so far as it has such stiffness as the resulting frame plate 11 is hard to be deformed, and the form thereof is stably retained. For example, various kinds of materials such as metallic materials, ceramic materials and resin materials may be used. When the frame plate 11 is formed by, for example, a metallic material, an insulating film may be formed on the surface of the frame plate 11.

Specific examples of the metallic material for forming the frame plate 11 include metals such as iron, copper, nickel, chromium, cobalt, magnesium, manganese, molybdenum, indium, lead, palladium, titanium, tungsten, aluminum, gold, platinum and silver, and alloys or alloy steels composed of a combination of at least two of these metals.

Specific examples of the resin material forming the frame plate 11 include liquid crystal polymers and polyimide resins.

The elastic polymeric substance forming the anisotropically conductive film 20 is preferably a heat-resistant polymeric substance having a crosslinked structure. As curable polymeric substance-forming materials usable for obtaining such crosslinked polymeric substances, various materials may be used. Specific examples thereof include silicone rubber; conjugated diene rubbers such as polybutadiene rubber, natural rubber, polyisoprene rubber, styrene-butadiene copolymer rubber and acrylonitrile-butadiene copolymer rubber, and hydrogenated products thereof; block copolymer rubbers such as styrene-butadiene-diene block terpolymer rubber and styrene-isoprene block copolymers, and hydrogenated products thereof; and chloroprene, urethane rubber, polyester rubber, epichlorohydrin rubber, ethylene-propylene copolymer rubber, ethylene-propylene-diene terpolymer rubber and soft liquid epoxy rubber.

Among these, silicone rubber is preferred from the viewpoints of molding and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

Among these, vinyl group-containing liquid silicone rubber (vinyl group-containing dimethyl polysiloxane) is generally obtained by subjecting dimethyldichlorosilane or dimethyldialkoxysilane to hydrolysis and condensation reaction in the presence of dimethylvinylchlorosilane or dimethylvinylalkoxysilane and then fractionating the reaction product by, for example, repeated dissolution-precipitation.

Liquid silicone rubber having vinyl groups at both terminals thereof is obtained by subjecting a cyclic siloxane such as octamethylcyclotetrasiloxane to anionic polymerization in the presence of a catalyst, using, for example, dimethyldivinylsiloxane as a polymerization terminator and suitably selecting other reaction conditions (for example, amounts of the cyclic siloxane and polymerization terminator). As the catalyst for the anionic polymerization used herein, may be used an alkali such as tetramethylammonium hydroxide or n-butyl-phosphonium hydroxide, or a silanolate solution thereof. The reaction is conducted at a temperature of, for example, 80 to 130° C.

Such a vinyl group-containing dimethyl polysiloxane preferably has a molecular weight Mw (weight average molecular weight as determined in terms of standard polystyrene equivalent; the same shall apply hereinafter) of 10,000 to 40,000. It also preferably has a molecular weight distribution index (a ratio Mw/Mn of weight average molecular weight Mw as determined in terms of standard polystyrene equivalent to number average molecular weight Mn as determined in terms of standard polystyrene equivalent; the same shall apply hereinafter) of at most 2 from the viewpoint of the heat resistance of the resulting elastic anisotropically conductive film 20.

On the other hand, hydroxyl group-containing liquid silicone rubber (hydroxyl group-containing dimethyl polysiloxane) is generally obtained by subjecting dimethyldichlorosilane or dimethyldialkoxysilane to hydrolysis and condensation reaction in the presence of dimethylhydrochlorosilane or dimethylhydroalkoxysilane and then fractionating the reaction product by, for example, repeated dissolution-precipitation.

The hydroxyl group-containing liquid silicone rubber is also obtained by subjecting a cyclic siloxane to anionic polymerization in the presence of a catalyst, using, for example, dimethylhydrochlorosilane, methyldihydrochlorosilane or dimethylhydroalkoxysilane as a polymerization terminator and suitably selecting other reaction conditions (for example, amounts of the cyclic siloxane and polymerization terminator). As the catalyst for the anionic polymerization, may be used an alkali such as tetramethylammonium hydroxide or n-butyl-phosphonium hydroxide or a silanolate solution thereof. The reaction is conducted at a temperature of, for example, 80 to 130° C.

Such a hydroxyl group-containing dimethyl polysiloxane preferably has a molecular weight Mw of 10,000 to 40,000. It also preferably has a molecular weight distribution index of at most 2 from the viewpoint of the heat resistance of the resulting elastic anisotropically conductive film 20.

In the present invention, either one of the above-described vinyl group-containing dimethyl polysiloxane or hydroxyl group-containing dimethyl polysiloxane may be used, or both may also be used in combination.

A curing catalyst for curing the polymeric substance-forming material may be contained in the polymeric substance-forming material. As such a curing catalyst, may be used an organic peroxide, fatty acid azo compound, hydrosilylated catalyst or the like.

Specific examples of the organic peroxide used as the curing catalyst include benzoyl peroxide, bisdicyclobenzoyl peroxide, dicumyl peroxide and di-tert-butyl peroxide.

Specific examples of the fatty acid azo compound used as the curing catalyst include azobisisobutyronitrile.

Specific examples of that used as the catalyst for hydrosilylation reaction include publicly known catalysts such as platinic chloride and salts thereof, platinum-unsaturated group-containing siloxane complexes, vinylsiloxane-platinum complexes, platinum-1,3-divinyltetramethyldisiloxane complexes, complexes of triorganophosphine or phosphite and platinum, acetyl acetate platinum chelates, and cyclic diene-platinum complexes.

The amount of the curing catalyst used is suitably selected in view of the kind of the polymeric substance-forming material, the kind of the curing catalyst and other curing treatment conditions. However, it is generally 3 to 15 parts by weight per 100 parts by weight of the polymeric substance-forming material.

In the polymeric substance-forming material, as needed, may be contained a general inorganic filler such as silica powder, colloidal silica, aerogel silica or alumina. By containing such an inorganic filler, the thixotropic property of the resulting molding material is secured, the viscosity thereof becomes high, the dispersion stability of conductive particles P is improved, and moreover the strength of the elastic anisotropically conductive film 20 obtained by the curing treatment can be made high.

No particular limitation is imposed on the amount of such an inorganic filler used. However, the use in a too large amount is not preferred because the movement of the conductive particles P by a magnetic field is greatly inhibited in a production process, which will be described subsequently.

As illustrated in FIG. 2, conductive particles P exhibiting magnetism are contained at a high density in the conductive parts 22 for connection and the conductive parts 26 for high-frequency shielding in the functional part 21 of the elastic anisotropically conductive film 20 in a state oriented so as to align in the thickness-wise direction of the film. On the other hand, the insulating part 23 does not contain the conductive particles P at all or scarcely contains them.

As the conductive particles P contained in the conductive parts 22 for connection and the conductive parts 26 for high-frequency shielding, those exhibiting magnetism are preferably used in that such conductive particles P can be easily moved in the molding material for forming the elastic anisotropically conductive film 20 by a process, which will be described subsequently. Specific examples of such conductive particles P exhibiting magnetism include particles of metals exhibiting magnetism, such as iron, cobalt and nickel, particles of alloys thereof, particles containing such a metal, particles obtained by using these particles as core particles and plating surfaces of the core particles with a metal having good conductivity, such as gold, silver, palladium or rhodium, particles obtained by using particles of a non-magnetic metal, particles of an inorganic substance, such as glass beads, or particles of a polymer as core particles and plating surfaces of the core particles with a conductive magnetic substance such as nickel or cobalt, and particles obtained by coating the core particles with both conductive magnetic substance and metal having good conductivity.

Among these, particles obtained by using nickel particles as core particles and plating their surfaces with a metal having good conductivity, such as gold or silver are preferably used.

No particular limitation is imposed on a means for coating the surfaces of the core particles with the conductive metal. However, for example, the coating may be conducted by electroless plating.

When those obtained by coating the surfaces of the core particles with the conductive metal are used as the conductive particles P, the coating rate (proportion of an area coated with the conductive metal to the surface area of the core particles) of the conductive metal on the particle surfaces is preferably at least 40%, more preferably at least 45%, particularly preferably 47 to 95% from the viewpoint of achieving good conductivity.

The amount of the conductive metal to be coated is preferably 2.5 to 50% by weight, more preferably 3 to 45% by weight, still more preferably 3.5 to 40% by weight, particularly preferably 5 to 30% by weight based on the core particles.

The particle diameter of the conductive particles P is preferably 1 to 500 μm, more preferably 2 to 400 μm, still more preferably 5 to 300 μm, particularly preferably 10 to 150 μm.

The particle diameter distribution (Dw/Dn) of the conductive particles P is preferably 1 to 10, more preferably 1 to 7, still more preferably 1 to 5, particularly preferably 1 to 4.

Conductive particles P satisfying such conditions are used, whereby the resulting elastic anisotropically conductive film 20 becomes easy to be deformed under pressure, and sufficient electrical contact is achieved among the conductive particles P in the conductive parts 22 for connection in the elastic anisotropically conductive film 20.

No particular limitation is imposed on the shape of the conductive particles P. However, they are preferably in the shape of a sphere or star, or secondary particles obtained by aggregating these particles from the viewpoint of permitting easy dispersion of these particles in the polymeric substance-forming material.

The content of water in the conductive particles P is preferably at most 5%, more preferably at most 3%, further preferably at most 2%, particularly preferably at most 1%. The use of conductive particles P satisfying such conditions can prevent or inhibit the molding material layer from causing bubbles therein upon the curing treatment of the molding material layer in the production process, which will be described subsequently.

Those obtained by treating surfaces of the conductive particles P with a coupling agent such as a silane coupling agent may be suitably used. By treating the surfaces of the conductive particles P with the coupling agent, the adhesion property of the conductive particles P to the elastic polymeric substance is improved, so that the resulting elastic anisotropically conductive film 20 becomes high in durability in repeated use.

The amount of the coupling agent used is suitably selected within limits not affecting the conductivity of the conductive particles P. However, it is preferably such an amount that a coating rate (proportion of an area coated with the coupling agent to the surface area of the conductive core particles) of the coupling agent on the surfaces of the conductive particles P amounts to at least 5%, more preferably 7 to 100%, further preferably 10 to 100%, particularly preferably 20 to 100%.

The proportion of the conductive particles P contained in the conductive parts 22 for connection in the functional part 21 is preferably 10 to 60%, more preferably 15 to 50% in terms of volume fraction. If this proportion is lower than 10%, conductive parts 22 for connection sufficiently low in electric resistance value may not be obtained in some cases. If the proportion exceeds 60% on the other hand, the resulting conductive parts 22 for connection are liable to be brittle, so that elasticity required of the conductive parts 22 for connection may not be achieved in some cases.

The proportion of the conductive particles P contained in the conductive parts 26 for high-frequency shielding is preferably 5 to 60%, more preferably 10 to 50% in terms of volume fraction. If this proportion is lower than 5%, the resulting conductive parts 26 for high-frequency shielding are liable to cause non-dense portions, so that it may be difficult in some cases to form conductive parts 26 for high-frequency shielding uniform in composition. If the proportion exceeds 60% on the other hand, the conductive particles are liable to remain between the conductive part 26 for high-frequency shielding and the conductive part 22 for connection adjoining each other upon the production of the anisotropically conductive elastomer sheet, so that insulating property between them tends to be insufficient to encounter difficulties upon the provision of an anisotropically conductive sheet usable in electrical inspection of a circuit device having a clock frequency of, for example, at least 1 GHz.

Such an anisotropically conductive connector 10 can be produced, for example, in the following manner.

A frame plate 11, in which an opening 12 has been formed, is first produced. As a method for forming the opening 12 in the frame plate 11, may be used, for example, an etching method or the like.

Figure 3:
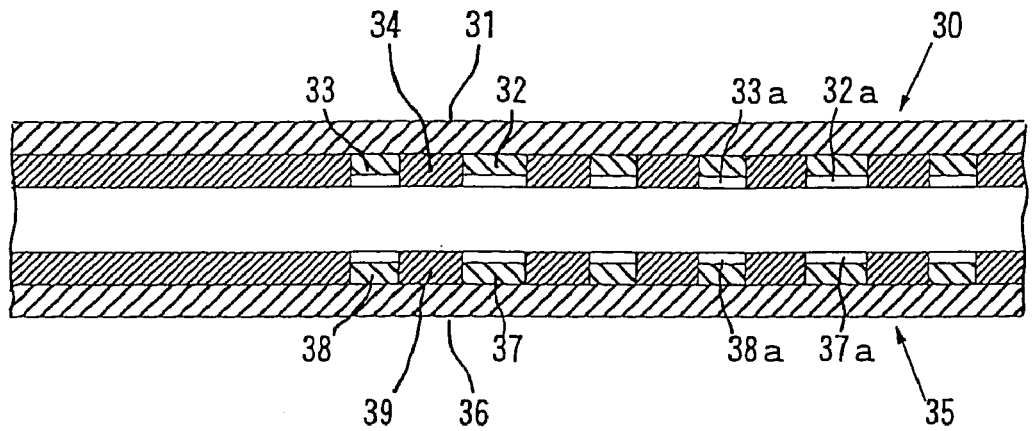
FIG. 3 is a cross-sectional view illustrating, on an enlarged scale, a principal part of a mold used for molding an elastic anisotropically conductive film in the anisotropically conductive connector according to the first embodiment.

A mold for molding an elastic anisotropically conductive film is provided. FIG. 3 is a cross-sectional view illustrating the construction of an exemplary mold for molding the elastic anisotropically conductive film. This mold is so constructed that a top force 30 and a bottom force 35 making a pair therewith are arranged so as to be opposed to each other.

In the top force 30, ferromagnetic substance layers 32 are formed on a lower surface of a ferromagnetic base plate 31 in accordance with a pattern antipodal to an arrangement pattern of conductive parts 22 for connection in an elastic anisotropically conductive film 20 to be molded, ferromagnetic substance layers 33 are formed in accordance with a pattern antipodal to an arrangement pattern of conductive parts 26 for high-frequency shielding, and non-magnetic substance layers 34 are formed in other regions than the regions, in which the ferromagnetic substance layers 32, 33 are formed. A molding surface is formed by these ferromagnetic substance layers 32, 33 and non-magnetic substance layers 34. Each of the ferromagnetic substance layers 32, 33 has a thickness smaller than that of the non-magnetic substance layers 34, whereby recessed parts 32a and 33a are formed in the molding surface of the top force 30 corresponding to projected parts 22a and 26a in the elastic anisotropically conductive film 20 to be molded.

In the bottom force 35 on the other hand, ferromagnetic substance layers 37 are formed on an upper surface of a ferromagnetic base plate 36 in accordance with the same pattern as the arrangement pattern of the conductive parts 22 for connection in the elastic anisotropically conductive film 20 to be molded, ferromagnetic substance layers 38 are formed in accordance with the same pattern as the arrangement pattern of the conductive parts 26 for high-frequency shielding, and non-magnetic substance layers 39 are formed in other regions than the regions, in which the ferromagnetic substance layers 37, 38 are formed. A molding surface is formed by these ferromagnetic substance layers 37, 38 and non-magnetic substance layers 39. Each of the ferromagnetic substance layers 37, 38 has a thickness smaller than that of the non-magnetic substance layers 39, whereby recessed parts 37a and 38a are formed in the molding surface of the bottom force 35 corresponding to the projected parts 22a and 26a in the elastic anisotropically conductive film 20 to be molded.

As a ferromagnetic substance for forming the respective ferromagnetic base plates 31 and 36 in the top force 30 and bottom force 35, may be used a ferromagnetic metal such as iron, iron-nickel alloy, iron-cobalt alloy, nickel or cobalt. The ferromagnetic base plates 31, 36 preferably have a thickness of 0.1 to 50 mm, and surfaces thereof are preferably smooth and subjected to a chemical degreasing treatment or mechanical polishing treatment.

As a material for forming the ferromagnetic substance layers 32, 33, and 37, 38 in both top force 30 and bottom force 35, may be used a ferromagnetic metal such as iron, iron-nickel alloy, iron-cobalt alloy, nickel or cobalt. These ferromagnetic substance layers 32, 33, and 37, 38 preferably have a thickness of at least 10 μm. When this thickness is at least 10 μm, a magnetic field having a sufficient intensity distribution can be applied to a molding material layer 20A. As a result, the conductive particles can be gathered at a high density to portions to become conductive parts 22 for connection and portions to become conductive parts 26 for high-frequency shielding in the molding material layer 20A, and so conductive parts 22 for connection and conductive parts 26 for high-frequency shielding having good conductivity can be provided.

As a material for forming the non-magnetic substance layers 34 and 39 in both top force 30 and bottom force 35, may be used a non-magnetic metal such as copper, a polymeric substance having heat resistance, or the like. However, a polymeric substance cured by radiation may preferably be used in that the non-magnetic substance layers 34, 39 can be easily formed by a technique of photolithography. As a material thereof, may be used, for example, a photoresist such as an acrylic type dry film resist, epoxy type liquid resist or polyimide type liquid resist.

A molding material for molding the elastic anisotropically conductive film with conductive particles exhibiting magnetism dispersed in a polymeric substance-forming material, which will become an elastic polymeric substance by a curing treatment, is then prepared.

Figure 4:
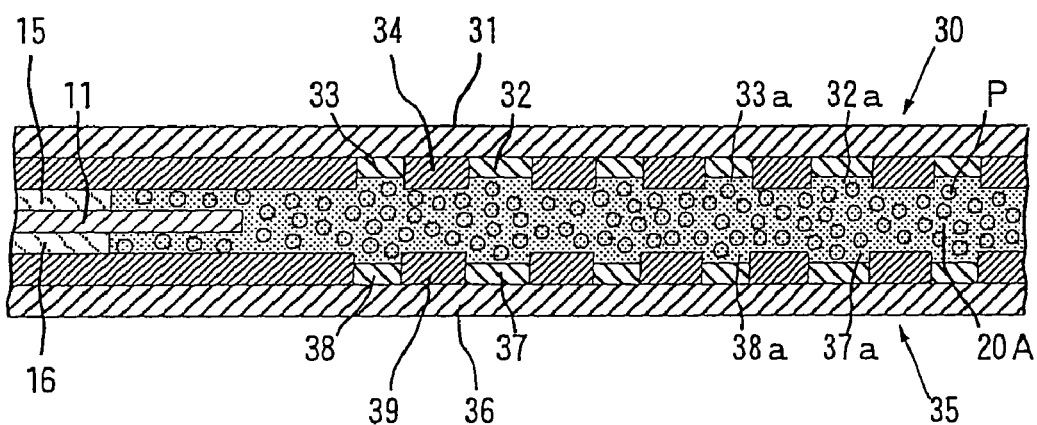
FIG. 4 is a cross-sectional view illustrating a state that a frame plate has been arranged in the mold shown in FIG. 3, and a molding material layer for the elastic anisotropically conductive film has been formed.

As illustrated in FIG. 4, the frame plate 11 is then arranged in alignment on the molding surface of the bottom force 35 through a spacer 16, and on the frame plate 11, the top force 30 is arranged in alignment through a spacer 15, whereby a molding cavity is defined between the top force 30 and the bottom force 35, and the molding material is charged into this molding cavity to form a molding material layer 20A. In the molding material layer 20A, the conductive particles P are contained in a state dispersed throughout in the molding material layer 20A.

Figure 5:
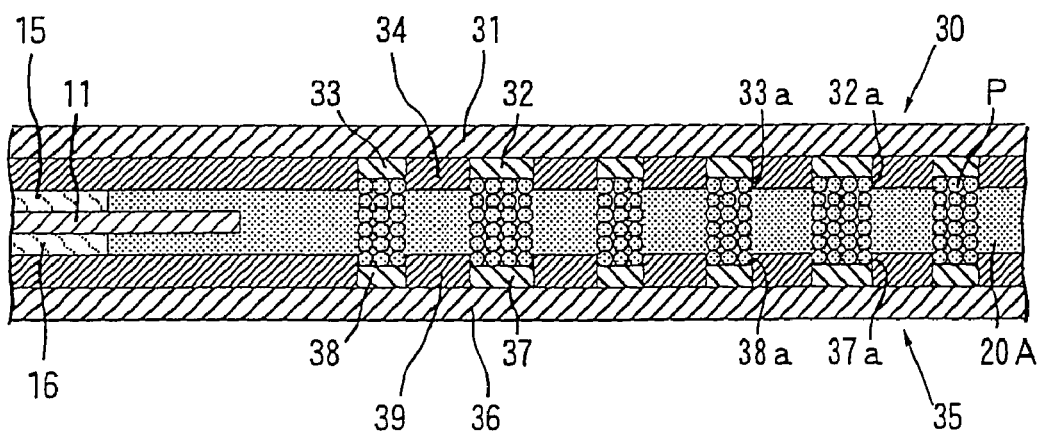
FIG. 5 is a cross-sectional view illustrating a state that a magnetic field having an intensity distribution has been applied to the molding material layer in a thickness-wise direction thereof.

A pair of, for example, electromagnets are then arranged on an upper surface of the ferromagnetic base plate 31 in the top force 30 and a lower surface of the ferromagnetic base plate 36 in the bottom force 35, and the electromagnets are operated, whereby a magnetic field having higher intensity is formed at portions between the ferromagnetic substance layers 32 of the top force 30 and their corresponding ferromagnetic substance layers 37 of the bottom force 35 and portions between the ferromagnetic substance layers 33 of the top force 30 and their corresponding ferromagnetic substance layers 38 of the bottom force 35 than surrounding regions thereof because the top force 30 and the bottom force 35 have the ferromagnetic substance layers 32, 33, and 37, 38, respectively. As a result, in the molding material layer 20A, the conductive particles P dispersed in the molding material layer 20A are gathered at portions to become the conductive parts 22 for connection located between the ferromagnetic substance layers 32 of the top force 30 and their corresponding ferromagnetic substance layers 37 of the bottom force 35 and portions to become the conductive parts 26 for high-frequency shielding located between the ferromagnetic substance layers 33 of the top force 30 and their corresponding ferromagnetic substance layers 38 of the bottom force 35, and oriented so as to align in the thickness-wise direction as illustrated in FIG. 5.

In this state, the molding material layer 20A is subjected to a curing treatment, whereby an elastic anisotropically conductive film 20 composed of a functional part 21, in which a plurality of the conductive parts 22 for connection containing the conductive particles P in the elastic polymeric substance in a state oriented so as to align in the thickness-wise direction, and the conductive parts 26 for high-frequency shielding surrounding the respective conductive parts 22 for connection are arranged in a state mutually insulated by an insulating part 23 composed of the polymeric elastic substance, in which the conductive particles P are not present at all or scarcely present, and a part 28 to be supported, which is formed continuously and integrally with a periphery of the functional part 21 and composed of the elastic polymeric substance, is formed in a state that the part 28 to be supported has been fixed to the opening edge in the frame plate 11, thus producing the anisotropically conductive connector 10.

In the above-described process, the intensity of the magnetic field applied to the portions to become the conductive parts 22 for connection and the portions to become the conductive parts 26 for high-frequency shielding in the molding material layer 20A is preferably an intensity that it amounts to 0.1 to 2.5 T on the average.

The curing treatment of the molding material layer 20A is suitably selected according to the material used. However, the treatment is generally conducted by a heating treatment. When the curing treatment of the molding material layer 20A is conducted by heating, it is only necessary to provide a heater in electromagnets. Specific heating temperature and heating time are suitably selected in view of the kinds of the polymeric substance-forming material forming the molding material layer 20A and the like, the time required for movement of the conductive particles P, and the like.

According to the anisotropically conductive connector 10 according to the first embodiment, in addition to the conductive parts 22 for connection to be electrically connected to electrodes that are an object of connection, the cylindrical conductive parts 26 for high-frequency shielding extending in the same direction as the conductive parts 22 for connection are arranged in the functional part 21 of the elastic anisotropically conductive film 20 in such a manner that they are located concentrically with the individual conductive parts 22 for connection, thereby surrounding the respective conductive parts 22 for connection. So that both external noises to high-frequency signals and noises from adjoining conductive parts 22 for connection can be controlled in each of the conductive parts 22 for connection by connecting the conductive parts 26 for high-frequency shielding to a ground. Accordingly, expected electrical inspection as to a circuit device, which is an object of inspection, can be performed without being influenced by the noises even when the clock frequency of the circuit device is, for example, at least 1 GHz in the case where the anisotropically conductive connector 10 according to the first embodiment is used in the electrical inspection of the circuit device.

Figure 6:
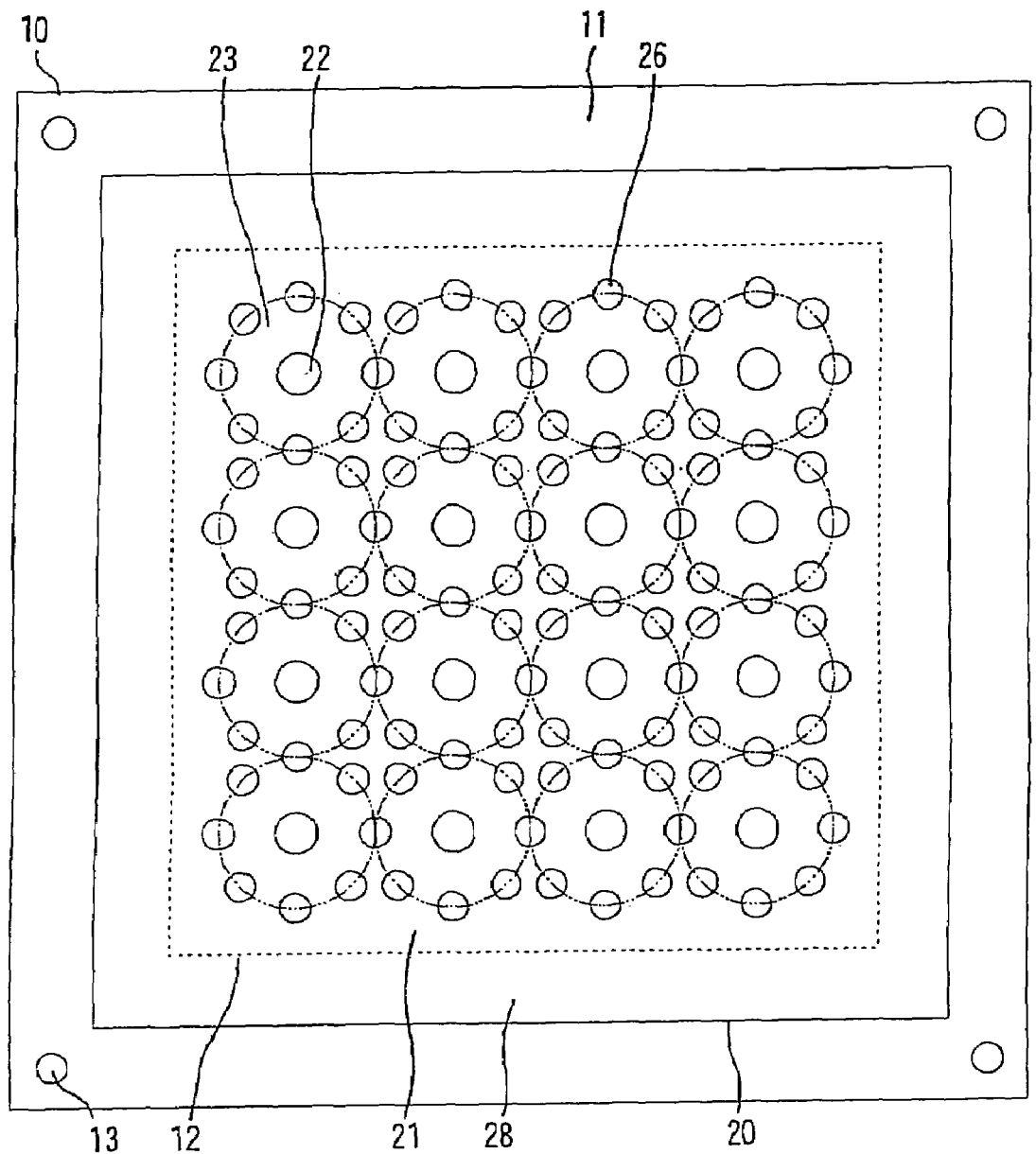
FIG. 6 is a plan view illustrating an anisotropically conductive connector according to a second embodiment of the present invention.
Figure 7:
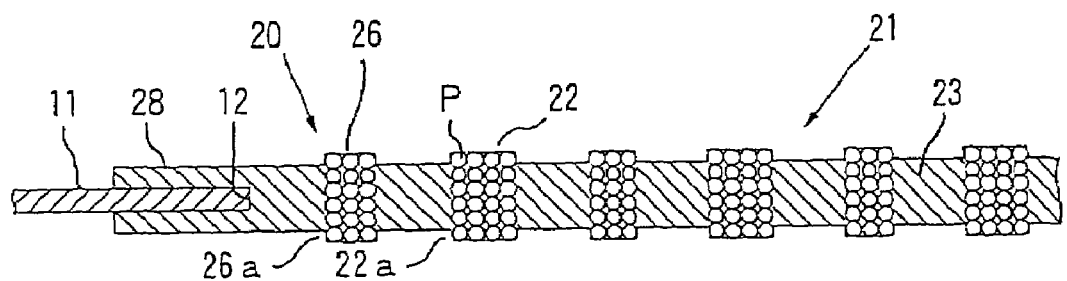
FIG. 7 is a cross-sectional view illustrating, on an enlarged scale, the construction of a principal part of the anisotropically conductive connector according to the second embodiment of the present invention.

FIG. 6 is a plan view illustrating an anisotropically conductive connector according to a second embodiment of the present invention, and FIG. 7 is a cross-sectional view illustrating, on an enlarged scale, the construction of a principal part of the anisotropically conductive connector according to the second embodiment.

The anisotropically conductive connector 10 according to the second embodiment has a frame plate 11 of the same construction as in the anisotropically conductive connector 10 according to the first embodiment, and an elastic anisotropically conductive film 20 having conductivity in a thickness-wise direction thereof is arranged on the opening 12 in this frame plate 11 in a state supported by an opening edge of the frame plate 11.

The elastic anisotropically conductive film 20 is composed of an elastic polymeric substance as a base material and has a functional part 21 composed of a plurality of conductive parts 22 for connection arranged in accordance with a pattern corresponding to a pattern of electrodes of a circuit device to be connected and each extending in the thickness-wise direction, a plurality of conductive parts 26 for high-frequency shielding arranged so as to surround the individual conductive parts 22 for connection and extending in the thickness-wise direction, and an insulating part 23 mutually insulating the respective conductive parts 22 for connection and the respective conductive parts 26 for high-frequency shielding. The functional part 21 is arranged so as to be located in the opening 12 in the frame plate 11.

In this embodiment, each of the conductive parts 22 for connection has a columnar form and is arranged in accordance with positions of lattice points. Each of the conductive parts 26 for high-frequency shielding has a columnar form, and a plurality (8 parts in the illustrated embodiment) of the conductive parts 26 for high-frequency shielding are arranged so as to surround each of the conductive parts 22 for connection along a concentric circle (indicated by an alternate long and two short dashes line in FIG. 6) having a diameter greater than the diameter of the conductive part 22 for connection. Projected parts 22a and 26a protruding from other surfaces than portions, at which the conductive parts 22 for connection and the conductive parts 26 for high-frequency shielding are located, are formed at those portions on both surfaces of the functional part 21 in the elastic anisotropically conductive film 20.

As illustrated in FIG. 7, conductive particles P exhibiting magnetism are contained at a high density in the conductive parts 22 for connection and the conductive parts 26 for high-frequency shielding in the functional part 21 of the elastic anisotropically conductive film 20 in a state oriented so as to align in the thickness-wise direction of the film. On the other hand, the insulating part 23 does not contain the conductive particles P at all or scarcely contains them.

At a peripheral edge of the functional part 21, a part 28 to be supported, which is fixed and supported by being laminated on an opening edge of the frame plate 11, is formed integrally and continuously with the functional part 21. More specifically, the part 28 to be supported in this embodiment is shaped in a forked form and fixed and supported in a closely contacted state so as to grasp the opening edge of the frame plate 11.

In such an anisotropically conductive connector 10, a clearance between conductive parts 26 for high-frequency shielding adjoining each other, which surround the same conductive part 22 for connection, is preferably at most 1/10 of a wavelength of a measurement signal. If this clearance is too great, a high-frequency noise becomes easy to pass through between the adjoining conductive parts 26 for high-frequency shielding, so that the shielding effect by the conductive parts 26 for high-frequency shielding is lowered, and so electrical inspection by high-frequency signals may become difficult in some cases.

As a material of the elastic polymeric substance for forming the elastic anisotropically conductive film and a material of the conductive particles P in the conductive parts 22 for connection and conductive parts 26 for high-frequency in the anisotropically conductive connector 10 according to the second embodiment, may be used the same materials as those in the anisotropically conductive connector 10 according to the first embodiment.

The anisotropically conductive connector 10 according to the second embodiment can be produced in accordance with the production process of the anisotropically conductive connector 10 according to the first embodiment.

According to the anisotropically conductive connector 10 according to the second embodiment, in addition to the conductive parts 22 for connection to be electrically connected to electrodes that are an object of connection, a plurality of the conductive parts 26 for high-frequency shielding extending in the same direction as the conductive parts 22 for connection are arranged in the functional part 21 of the elastic anisotropically conductive film 20 so as to surround each of the conductive parts 22 for connection along a concentric circle with the conductive part 22 for connection. So that both external noises to high-frequency signals and noises from adjoining conductive parts 22 for connection can be controlled in each of the conductive parts 22 for connection by connecting the conductive parts 26 for high-frequency shielding to a ground. Accordingly, expected electrical inspection as to a circuit device, which is an object of inspection, can be performed without being influenced by the noises even when the clock frequency of the circuit device is, for example, at least 1 GHz in the case where the anisotropically conductive connector 10 according to the second embodiment is used in the electrical inspection of the circuit device.

Figure 8:
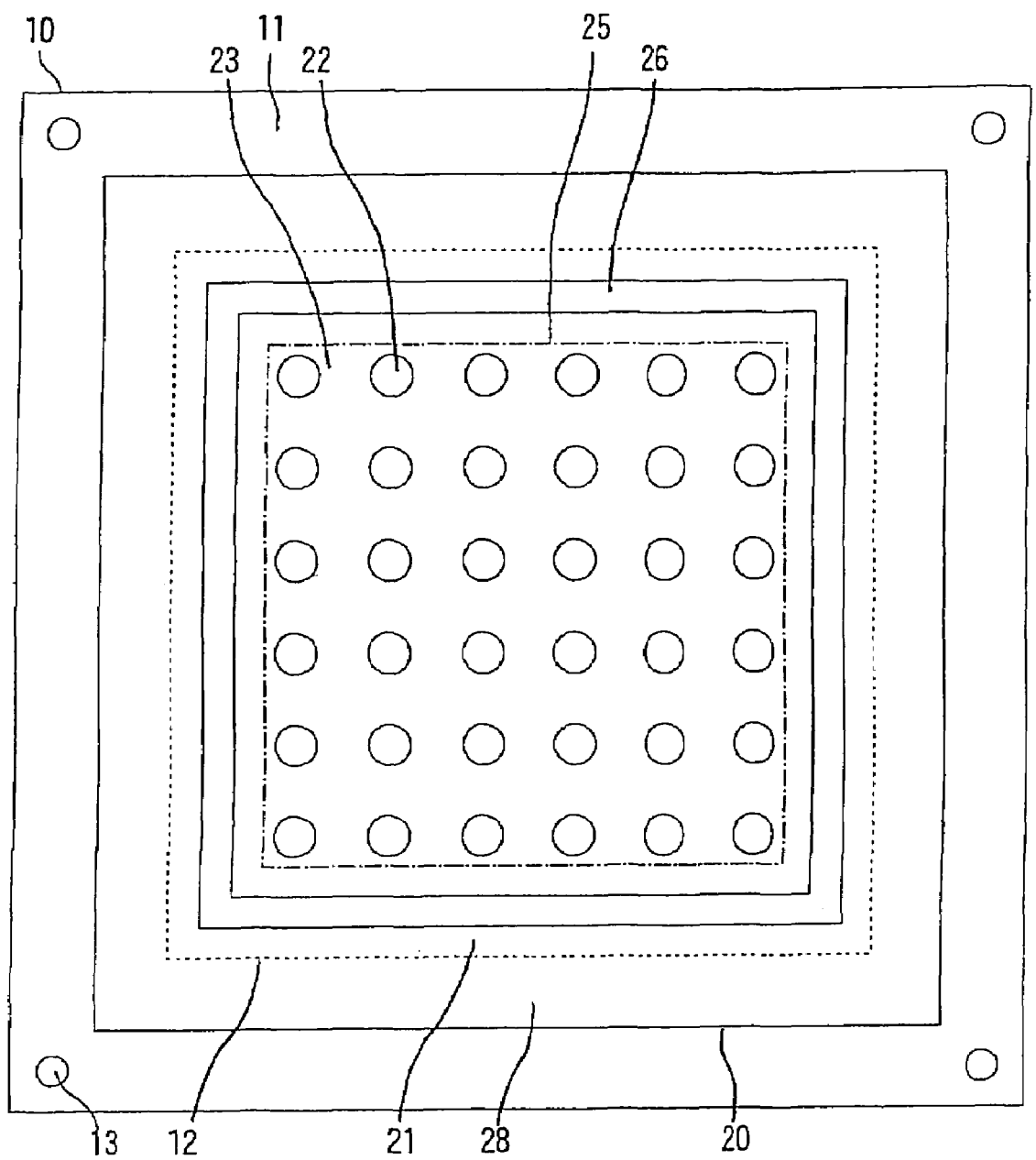
FIG. 8 is a plan view illustrating an anisotropically conductive connector according to a third embodiment of the present invention.
Figure 9:
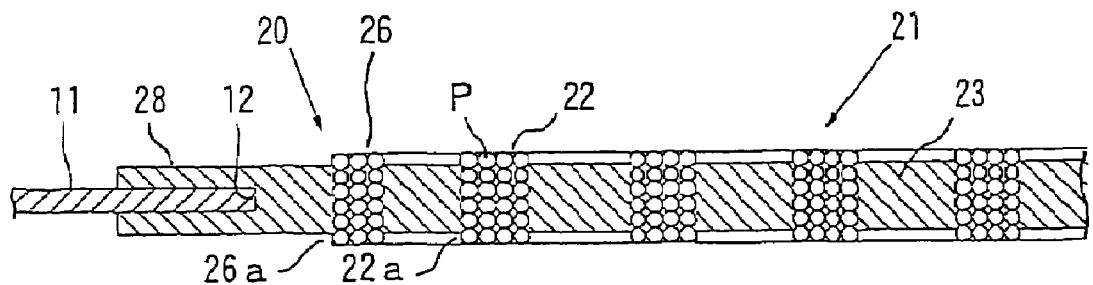
FIG. 9 is a cross-sectional view illustrating, on an enlarged scale, the construction of a principal part of the anisotropically conductive connector according to the third embodiment of the present invention.

FIG. 8 is a plan view illustrating an anisotropically conductive connector according to a third embodiment of the present invention, and FIG. 9 is a cross-sectional view illustrating, on an enlarged scale, the construction of a principal part of the anisotropically conductive connector according to the third embodiment.

The anisotropically conductive connector 10 according to the third embodiment has a frame plate 11 of the same construction as in the anisotropically conductive connector 10 according to the first embodiment, and an elastic anisotropically conductive film 20 having conductivity in a thickness-wise direction thereof is arranged on the opening 12 in this frame plate 11 in a state supported by an opening edge of the frame plate 11.

The elastic anisotropically conductive film 20 is composed of an elastic polymeric substance as a base material and has a functional part 21 composed of a plurality of conductive parts 22 for connection arranged in accordance with a pattern corresponding to a pattern of electrodes of a circuit device to be connected and each extending in the thickness-wise direction, a conductive part 26 for high-frequency shielding arranged so as to surround a group 25 of conductive parts including the plurality of the conductive parts 22 for connection and extending in the thickness-wise direction, and an insulating part 23 mutually insulating the respective conductive parts 22 for connection and the conductive part 26 for high-frequency shielding. This functional part 21 is arranged so as to be located in the opening 12 in the frame plate 11.

In this embodiment, each of the conductive parts 22 for connection has a columnar form and is arranged in accordance with positions of lattice points. The conductive part 26 for high-frequency shielding having a form of rectangular pipe, the size of a pipe hole of which is greater than the size of the group 25 of conductive parts, is arranged in such a manner that the group 25 of conductive parts is received in the pipe hole so as to surround the group 25 of conductive parts. Projected parts 22a and 26a protruding from other surfaces than portions, at which the conductive parts 22 for connection and the conductive part 26 for high-frequency shielding are located, are formed at those portions on both surfaces of the functional part 21 in the elastic anisotropically conductive film 20.

As illustrated in FIG. 9, conductive particles P exhibiting magnetism are contained at a high density in the conductive parts 22 for connection and the conductive part 26 for high-frequency shielding in the functional part 21 of the elastic anisotropically conductive film 20 in a state oriented so as to align in the thickness-wise direction of the film. On the other hand, the insulating part 23 does not contain the conductive particles P at all or scarcely contains them.

At a peripheral edge of the functional part 21, a part 28 to be supported, which is fixed and supported by being laminated on an opening edge of the frame plate 11, is formed integrally and continuously with the functional part 21.

More specifically, the part 28 to be supported in this embodiment is shaped in a forked form and fixed and supported in a closely contacted state so as to grasp the opening edge of the frame plate 11.

In this anisotropically conductive connector 10 according to the third embodiment, as a material of the elastic polymeric substance for forming the elastic anisotropically conductive film and a material of the conductive particles P in the conductive parts 22 for connection and conductive part 26 for high-frequency, may be used the same materials as those in the anisotropically conductive connector 10 according to the first embodiment.

The anisotropically conductive connector 10 according to the third embodiment can be produced in accordance with the production process of the anisotropically conductive connector 10 according to the first embodiment.

According to the anisotropically conductive connector 10 according to the third embodiment, in addition to the conductive parts 22 for connection to be electrically connected to electrodes that are an object of connection, the conductive part 26 for high-frequency shielding of rectangular pipe extending in the same direction as the conductive parts 22 for connection is arranged in the functional part 21 of the elastic anisotropically conductive film 20 in such a manner that the group 25 of conductive parts including all the conductive parts 22 for connection is received in the pipe hole thereof, thereby surrounding the group 25 of conductive part. So that an external noise to high-frequency signals can be controlled in each of the conductive parts 22 for connection by connecting the conductive part 26 for high-frequency shielding to a ground. Accordingly, expected electrical inspection as to a circuit device, which is an object of inspection, can be performed without being influenced by the noise even when the clock frequency of the circuit device is, for example, at least 1 GHz in the case where the anisotropically conductive connector 10 according to the third embodiment is used in the electrical inspection of the circuit device.

Figure 10:
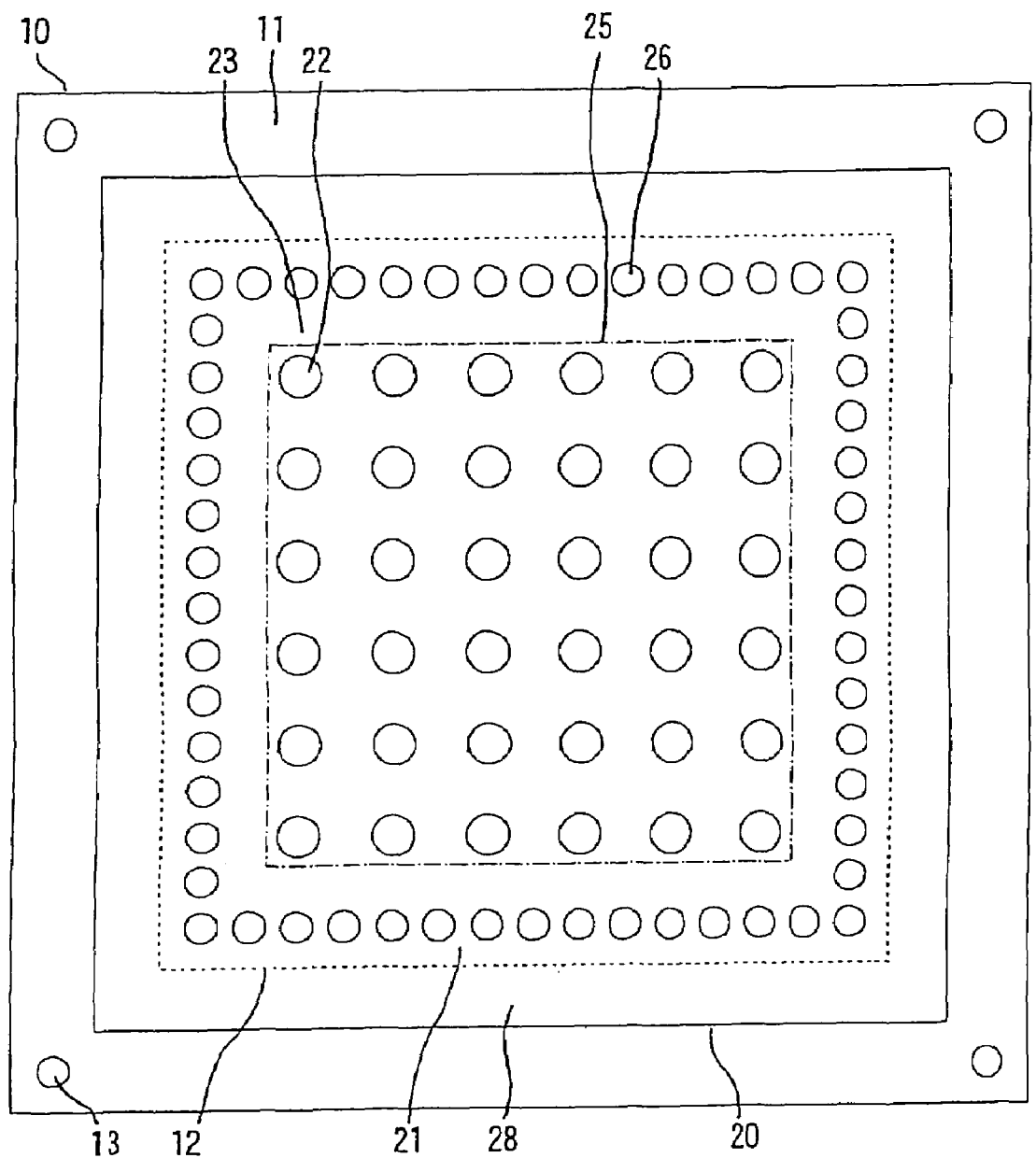
FIG. 10 is a plan view illustrating an anisotropically conductive connector according to a fourth embodiment of the present invention.
Figure 11:
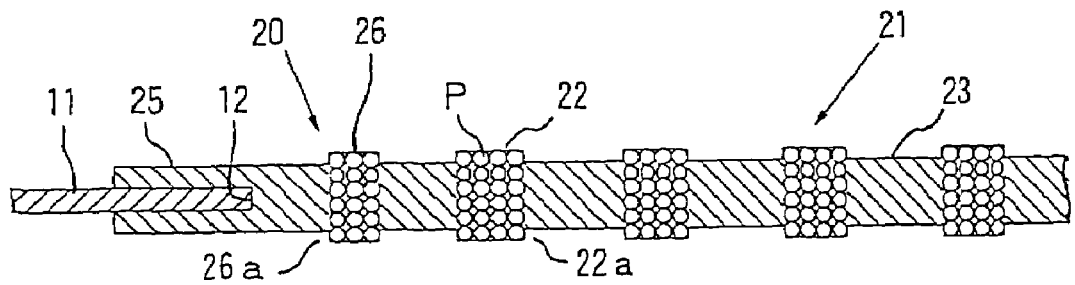
FIG. 11 is a cross-sectional view illustrating, on an enlarged scale, the construction of a principal part of the anisotropically conductive connector according to the fourth embodiment of the present invention.

FIG. 10 is a plan view illustrating an anisotropically conductive connector according to a fourth embodiment of the present invention, and FIG. 11 is a cross-sectional view illustrating, on an enlarged scale, the construction of a principal part of the anisotropically conductive connector according to the fourth embodiment.

The anisotropically conductive connector 10 according to the fourth embodiment has a frame plate 11 of the same construction as in the anisotropically conductive connector 10 according to the first embodiment, and an elastic anisotropically conductive film 20 having conductivity in a thickness-wise direction thereof is arranged on the opening 12 in this frame plate 11 in a state supported by an opening edge of the frame plate 11.

The elastic anisotropically conductive film 20 is composed of an elastic polymeric substance as a base material and has a functional part 21 composed of a plurality of conductive parts 22 for connection arranged in accordance with a pattern corresponding to a pattern of electrodes of a circuit device to be connected and each extending in the thickness-wise direction, a plurality of conductive parts 26 for high-frequency shielding arranged so as to surround a group 25 (indicated by an alternate long and short dash line in FIG. 10) of conductive parts including all the conductive parts 22 for connection and extending in the thickness-wise direction, and an insulating part 23 mutually insulating the respective conductive parts 22 for connection and conductive parts 26 for high-frequency shielding. The functional part 21 is arranged so as to be located in the opening 12 in the frame plate 11.

In this embodiment, each of the conductive parts 22 for connection has a columnar form and is arranged in accordance with positions of lattice points. Each of the conductive parts 26 for high-frequency shielding has a columnar form, and the plurality of the conductive parts 26 for high-frequency shielding are arranged so as to surround the group 25 of conductive parts along sides of a rectangle having a size greater than the size of the group 25 of conductive parts. Projected parts 22a and 26a protruding from other surfaces than portions, at which the conductive parts 22 for connection and the conductive parts 26 for high-frequency shielding are located, are formed at those portions on both surfaces of the functional part 21 in the elastic anisotropically conductive film 20.

As illustrated in FIG. 11, conductive particles P exhibiting magnetism are contained at a high density in the conductive parts 22 for connection and the conductive parts 26 for high-frequency shielding in the functional part 21 of the elastic anisotropically conductive film 20 in a state oriented so as to align in the thickness-wise direction of the film. On the other hand, the insulating part 23 does not contain the conductive particles P at all or scarcely contains them.

At a peripheral edge of the functional part 21, a part 28 to be supported, which is fixed and supported by being laminated on an opening edge in the frame plate 11, is formed integrally and continuously with the functional part 21. More specifically, the part 28 to be supported in this embodiment is shaped in a forked form and fixed and supported in a closely contacted state so as to grasp the opening edge of the frame plate 11.

In such an anisotropically conductive connector 10, a clearance between conductive parts 26 for high-frequency shielding adjoining each other, which surround the group 25 of conductive parts, is preferably at most $\frac{1}{10}$ of a wavelength of a measurement signal. If this clearance is too great, a high-frequency noise becomes easy to pass through between the adjoining conductive parts 26 for high-frequency shielding, so that the shielding effect by the conductive parts 26 for high-frequency shielding is lowered, and so electrical inspection by high-frequency signals may become difficult in some cases.

As a material of the elastic polymeric substance for forming the elastic anisotropically conductive film and a material of the conductive particles P in the conductive parts 22 for connection and conductive parts 26 for high-frequency in the anisotropically conductive connector 10 according to the fourth embodiment, may be used the same materials as those in the anisotropically conductive connector 10 according to the first embodiment.

The anisotropically conductive connector according to the fourth embodiment can be produced in accordance with the production process of the anisotropically conductive connector 10 according to the first embodiment.

According to the anisotropically conductive connector 10 according to the fourth embodiment, in addition to the conductive parts 22 for connection to be electrically connected to electrodes that are an object of connection, a plurality of the conductive parts 26 for high-frequency shielding extending in the same direction as the conductive parts 22 for connection are arranged in the functional part 21 of the elastic anisotropically conductive film 20 so as to surround the group 25 of the conductive parts including all the conductive parts 22 for connection. So that an external noise to high-frequency signals can be controlled in each of the conductive parts 22 for connection by connecting the conductive parts 26 for high-frequency shielding to a ground. Accordingly, expected electrical inspection as to a circuit device, which is an object of inspection, can be performed without being influenced by the noise even when the clock frequency of the circuit device is, for example, at least 1 GHz in the case where the anisotropically conductive connector 10 according to the fourth embodiment is used in the electrical inspection of the circuit device.

Figure 12:
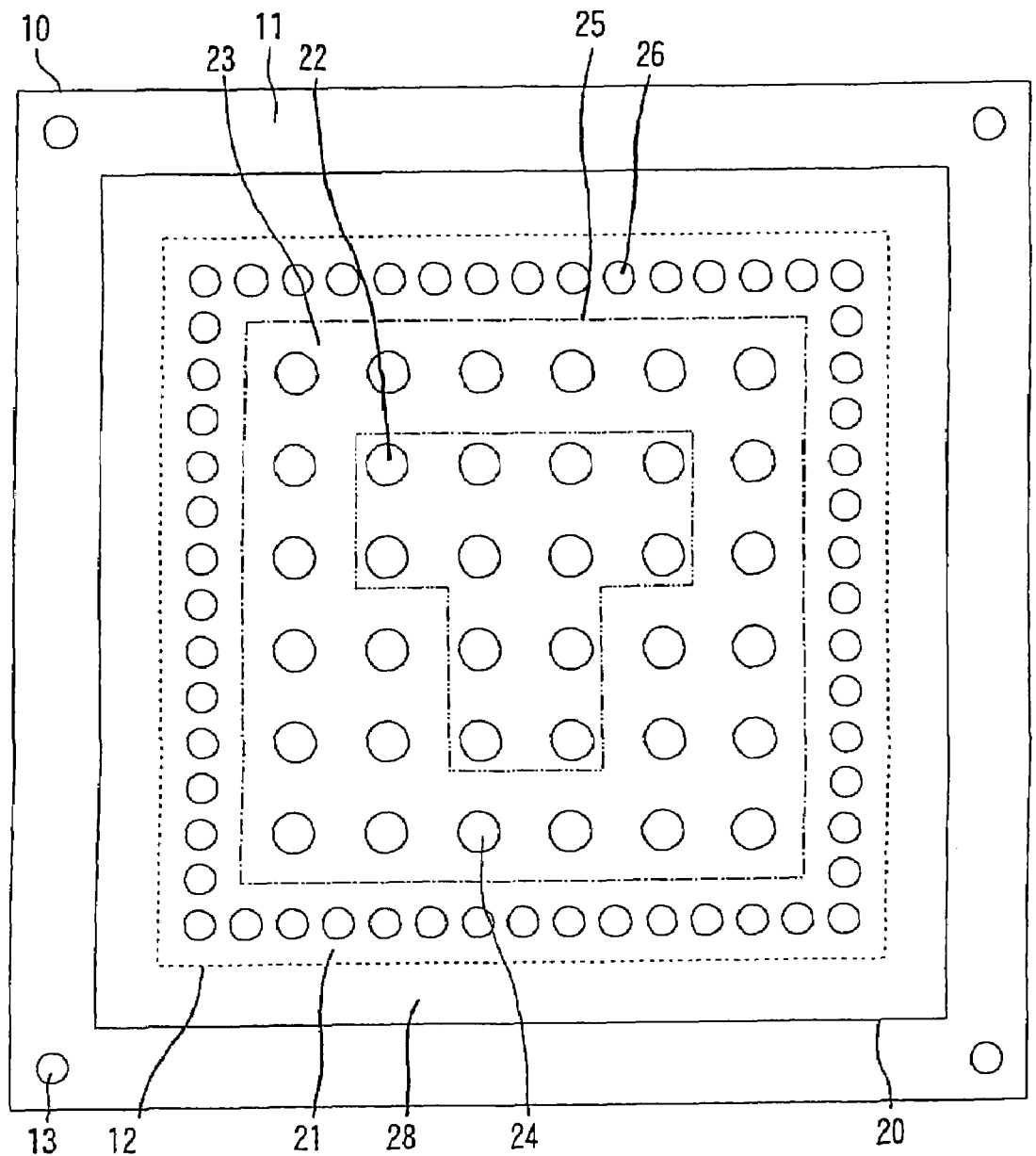
FIG. 12 is a plan view illustrating an anisotropically conductive connector according to a fifth embodiment of the present invention.
Figure 13:
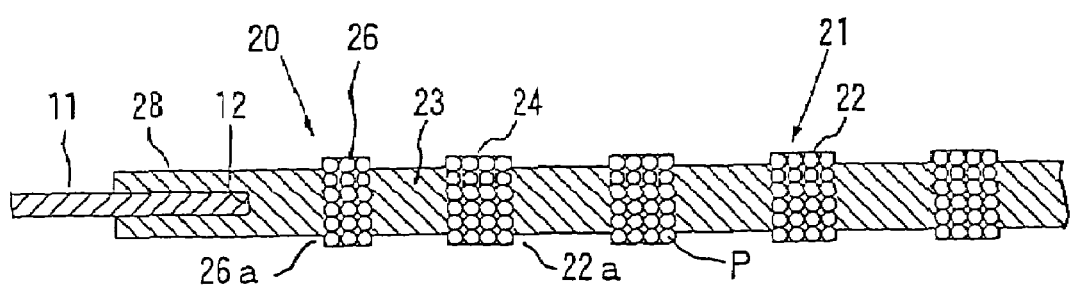
FIG. 13 is a cross-sectional view illustrating, on an enlarged scale, the construction of a principal part of the anisotropically conductive connector according to the fifth embodiment of the present invention.

FIG. 12 is a plan view illustrating an anisotropically conductive connector according to a fifth embodiment of the present invention, and FIG. 13 is a cross-sectional view illustrating, on an enlarged scale, the construction of a principal part of the anisotropically conductive connector according to the fifth embodiment.

The anisotropically conductive connector 10 according to the fifth embodiment has a frame plate 11 of the same construction as in the anisotropically conductive connector 10 according to the first embodiment, and an elastic anisotropically conductive film 20 having conductivity in a thickness-wise direction thereof is arranged on the opening 12 in this frame plate 11 in a state supported by an opening edge of the frame plate 11.

The elastic anisotropically conductive film 20 is composed of an elastic polymeric substance as a base material and has a functional part 21 composed of a plurality of conductive parts 22 for connection arranged in accordance with a pattern corresponding to a pattern of electrodes of a circuit device to be connected and each extending in the thickness-wise direction, a plurality of conductive parts 24 for non-connection formed about a group (indicated by an alternate long and two short dashes line in FIG. 12) of conductive parts for connection including these conductive parts 22 for connection, a plurality of conductive parts 26 for high-frequency shielding arranged so as to surround a group 25 (indicated by an alternate long and short dash line in FIG. 12) of conductive parts including all the conductive parts 22 for connection and all the conductive parts 24 for non-connection and extending in the thickness-wise direction, and an insulating part 23 mutually insulating the respective conductive parts 22 for connection and conductive parts 26 for high-frequency shielding. The functional part 21 is arranged so as to be located in the opening 12 in the frame plate 11.

In this embodiment, each of the conductive parts 22 for connection and conductive parts 24 for non-connection has a columnar form and is arranged in accordance with positions of lattice points. Each of the conductive parts 26 for high-frequency shielding has a columnar form, and the plurality of the conductive parts 26 for high-frequency shielding are arranged so as to surround the group 25 of conductive parts along sides of a rectangle having a size greater than the size of the group 25 of conductive parts. Projected parts 22*a* and 26*a* protruding from other surfaces than portions, at which the conductive parts 22 for connection and the conductive parts 26 for high-frequency shielding are located, are formed at those portions on both surfaces of the functional part 21 in the elastic anisotropically conductive film 20.

As illustrated in FIG. 13, conductive particles P exhibiting magnetism are contained at a high density in the conductive parts 22 for connection and the conductive parts 26 for high-frequency shielding in the functional part 21 of the elastic anisotropically conductive film 20 in a state oriented so as to align in the thickness-wise direction of the film. On the other hand, the insulating part 23 does not contain the conductive particles P at all or scarcely contains them.

At a peripheral edge of the functional part 21, a part 28 to be supported, which is fixed and supported by being laminated on an opening edge of the frame plate 11, is formed integrally and continuously with the functional part 21. More specifically, the part 28 to be supported in this embodiment is shaped in a forked form and fixed and supported in a closely contacted state so as to grasp the opening edge of the frame plate 11.

As a material of the elastic polymeric substance for forming the elastic anisotropically conductive film and a material of the conductive particles P in the conductive parts 22 for connection and conductive parts 26 for high-frequency in the anisotropically conductive connector 10 according to the fifth embodiment, may be used the same materials as those in the anisotropically conductive connector 10 according to the first embodiment.

A clearance between conductive parts 26 for high-frequency shielding adjoining each other, which surround the group 25 of conductive parts, is the same as in the anisotropically conductive connector 10 according to the fourth embodiment.

The anisotropically conductive connector 10 according to the fifth embodiment can be produced in accordance with the production process of the anisotropically conductive connector 10 according to the first embodiment.

According to the anisotropically conductive connector 10 according to the fifth embodiment, in addition to the conductive parts 22 for connection to be electrically connected to electrodes that are an object of connection, a plurality of the conductive parts 26 for high-frequency shielding extending in the same direction as the conductive parts 22 for connection are arranged in the functional part 21 of the elastic anisotropically conductive film 20 so as to surround the group 25 of the conductive parts including all the conductive parts 22 for connection. So that an external noise to high-frequency signals can be controlled in each of the conductive parts 22 for connection by connecting the conductive parts 26 for high-frequency shielding to a ground. Accordingly, expected electrical inspection as to a circuit device, which is an object of inspection, can be performed without being influenced by the noise even when the clock frequency of the circuit device is, for example, at least 1 GHz in the case where the anisotropically conductive connector 10 according to the fifth embodiment is used in the electrical inspection of the circuit device.

Figure 14:
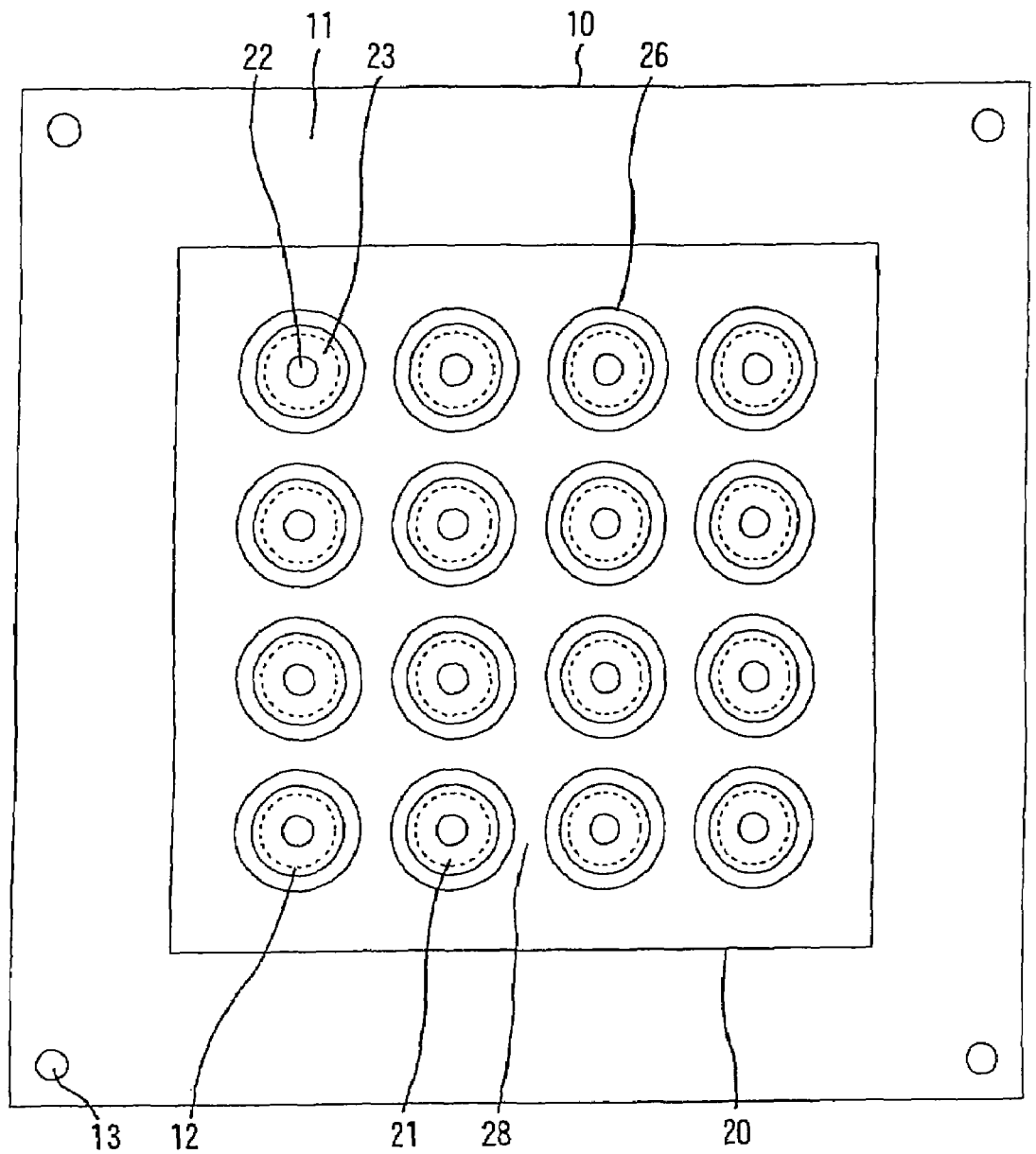
FIG. 14 is a plan view illustrating an anisotropically conductive connector according to a sixth embodiment of the present invention.
Figure 15:
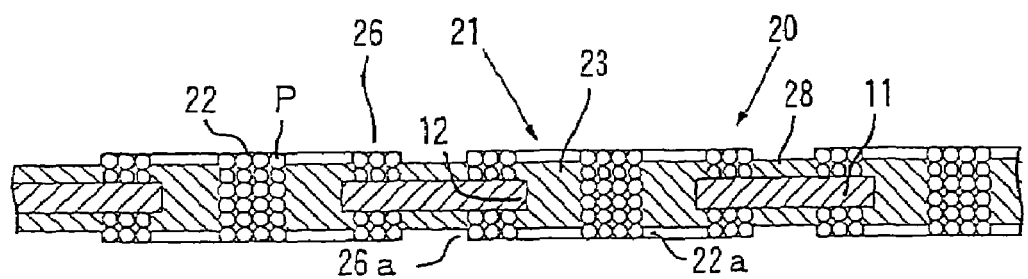
FIG. 15 is a cross-sectional view illustrating, on an enlarged scale, the construction of a principal part of the anisotropically conductive connector according to the sixth embodiment of the present invention.

FIG. 14 is a plan view illustrating an anisotropically conductive connector according to a sixth embodiment of the present invention, and FIG. 15 is a cross-sectional view illustrating, on an enlarged scale, the construction of a principal part of the anisotropically conductive connector according to the sixth embodiment.

The anisotropically conductive connector 10 according to the sixth embodiment has a frame plate 11 in the shape of a rectangle as a whole, in which a plurality of circular openings 12 (each indicated by a broken line in FIG. 14) have been formed in accordance with a pattern corresponding to a pattern of electrodes to be connected, and a rectangular elastic anisotropically conductive film 20 having conductivity in a thickness-wise direction thereof is fixed to and supported by the frame plate 11. In this embodiment, positioning holes 13 for conducting positioning to a circuit device to be connected are formed at positions of 4 corners in the frame plate 11.

The elastic anisotropically conductive film 20 is composed of an elastic polymeric substance as a base material and has a plurality of functional parts 21 each composed of a columnar conductive part 22 for connection extending in the thickness-wise direction, and an insulating part 23 formed integrally with a periphery of the conductive part 22 for connection. Each of these functional parts 21 is arranged so as to be located in the respective openings 12 of the frame plate 11.

At the peripheral edge of each of the functional parts 21, a part 28 to be supported, which is fixed and supported by being laminated on each of both surfaces of the frame plate 11, is formed integrally and continuously with the respective functional parts 21. In this part 28 to be supported, a plurality of conductive parts 26 for high-frequency shielding each extending in the thickness-wise direction and electrically connected to the frame plate 11 are formed. Each of these conductive parts 26 for high-frequency shielding has a cylindrical form having an inner diameter greater than the diameter of the conductive part 22 for connection and is arranged by being located concentrically with one conductive part 22 for connection so as to surround the conductive part 22 for connection. Projected parts 22a and 26a protruding from other surfaces than portions, at which the conductive parts 22 for connection and the conductive parts 26 for high-frequency shielding are located, are formed at those portions on both surfaces of the elastic anisotropically conductive film 20.

As illustrated in FIG. 15, conductive particles P exhibiting magnetism are contained at a high density in the conductive part 22 for connection in each functional part 21 and the conductive parts 26 for high-frequency shielding in the part 28 to be supported in the elastic anisotropically conductive film 20 in a state oriented so as to align in the thickness-wise direction of the film. On the other hand, the insulating part 23 in each functional part 21 and portions other than the conductive parts 26 for high-frequency shielding in the part 28 to be supported do not contain the conductive particles P at all or scarcely contains them.

No particular limitation is imposed on a material for forming the frame plate 11 so far as it has conductivity and such stiffness as the resulting frame plate 11 is hard to be deformed, and the form thereof is stably retained. However, a metallic material is preferably used.

Specific examples of the metallic material for forming the frame plate 11 include metals such as iron, copper, nickel, chromium, cobalt, magnesium, manganese, molybdenum, indium, lead, palladium, titanium, tungsten, aluminum, gold, platinum and silver, and alloys or alloy steels composed of a combination of at least two of these metals.

As a material of the elastic polymeric substance for forming the elastic anisotropically conductive film and a material of the conductive particles P in the conductive parts 22 for connection and conductive parts 26 for high-frequency shielding in the anisotropically conductive connector 10 according to the sixth embodiment, may be used the same materials as those in the anisotropically conductive connector 10 according to the first embodiment.

The anisotropically conductive connector 10 according to the sixth embodiment can be produced in accordance with the production process of the anisotropically conductive connector 10 according to the first embodiment.

According to the anisotropically conductive connector 10 according to the sixth embodiment, in addition to the conductive parts 22 for connection arranged in the respective functional parts 21 and to be electrically connected to electrodes that are an object of connection, the cylindrical conductive parts 26 for high-frequency shielding extending in the same direction as the conductive parts 22 for connection are arranged in the part 28 to be supported of the elastic anisotropically conductive film 20 in such a manner that they are located concentrically with the individual conductive parts 22 for connection, thereby surrounding the respective conductive parts 22 for connection, and further each of the conductive parts 26 for high-frequency shielding is electrically connected to the frame plate 11 having conductivity. So that both external noises and noises from adjoining conductive parts 22 for connection to high-frequency signals can be controlled in each of the conductive parts 22 for connection by connecting the frame plate 11 to a ground. Accordingly, expected electrical inspection as to a circuit device, which is an object of inspection, can be performed without being influenced by the noises even when the clock frequency of the circuit device is, for example, at least 1 GHz in the case where the anisotropically conductive connector 10 according to the sixth embodiment is used in the electrical inspection of the circuit device.

Figure 16:
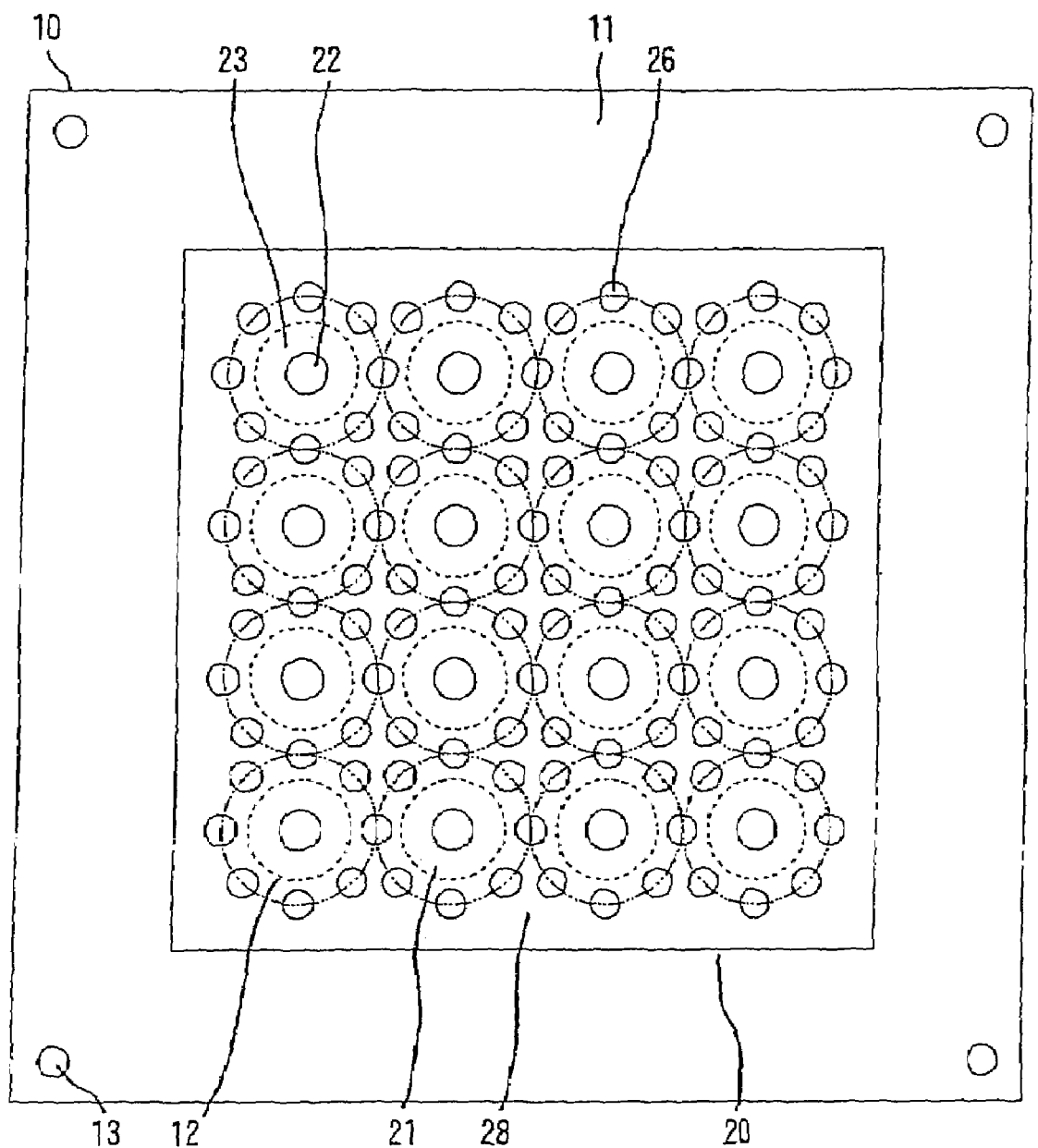
FIG. 16 is a plan view illustrating an anisotropically conductive connector according to a seventh embodiment of the present invention.
Figure 17:
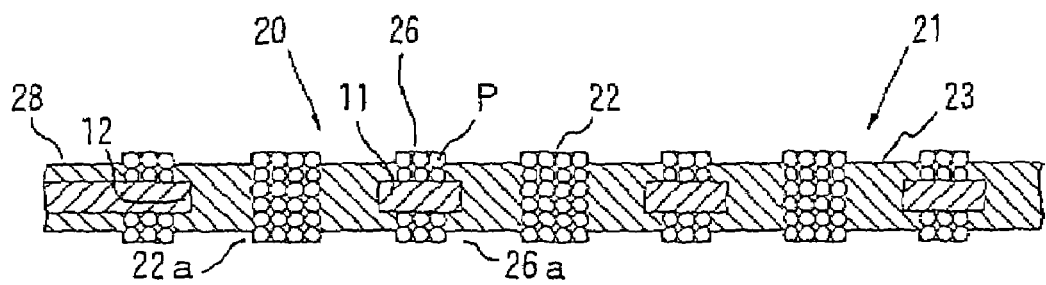
FIG. 17 is a cross-sectional view illustrating, on an enlarged scale, the construction of a principal part of the anisotropically conductive connector according to the seventh embodiment of the present invention.

FIG. 16 is a plan view illustrating an anisotropically conductive connector according to a seventh embodiment of the present invention, and FIG. 17 is a cross-sectional view illustrating, on an enlarged scale, the construction of a principal part of the anisotropically conductive connector according to the seventh embodiment.

The anisotropically conductive connector 10 according to the seventh embodiment has a frame plate 11 of the same construction as in the anisotropically conductive connector 10 according to the sixth embodiment, and a rectangular elastic anisotropically conductive film 20 having conductivity in a thickness-wise direction thereof is fixed to and supported by the frame plate 11.

The elastic anisotropically conductive film 20 is composed of an elastic polymeric substance as a base material and has a plurality of functional parts 21 each composed of a columnar conductive part 22 for connection extending in the thickness-wise direction, and an insulating part 23 formed integrally with a periphery of the conductive part 22 for connection. Each of these functional parts 21 is arranged so as to be located in the respective openings 12 of the frame plate 11.

At the peripheral edge of each of the functional parts 21, a part 28 to be supported, which is fixed and supported by being laminated on both surfaces of the frame plate 11, is formed integrally and continuously with the each functional parts 21. In this part 28 to be supported, a plurality of conductive parts 26 for high-frequency shielding each extending in the thickness-wise direction and electrically connected to the frame plate 11 are formed. Each of the conductive parts 26 for high-frequency shielding has a columnar form, and a plurality (8 parts in the illustrated embodiment) of the conductive parts 26 for high-frequency shielding are arranged so as to surround each of the conductive parts 22 for connection along a concentric circle (indicated by an alternate long and two short dashes line in FIG. 16) having a diameter greater than the diameter of the conductive part 22 for connection. Projected parts 22a and 26a protruding from other surfaces than portions, at which the conductive parts 22 for connection and the conductive parts 26 for high-frequency shielding are located, are formed at those portions on both surfaces of the elastic anisotropically conductive film 20.

As illustrated in FIG. 17, conductive particles P exhibiting magnetism are contained at a high density in the conductive part 22 for connection in each functional part 21 and the conductive parts 26 for high-frequency shielding in the part 28 to be supported in the elastic anisotropically conductive film 20 in a state oriented so as to align in the thickness-wise direction of the film. On the other hand, the insulating part 23 in each functional part 21 and portions other than the conductive parts 26 for high-frequency shielding in the part 28 to be supported do not contain the conductive particles P at all or scarcely contains them.

As a material of the elastic polymeric substance for forming the elastic anisotropically conductive film and a material of the conductive particles P in the conductive parts 22 for connection and conductive parts 26 for high-frequency shielding in the anisotropically conductive connector 10 according to the seventh embodiment, may be used the same materials as those in the anisotropically conductive connector 10 according to the first embodiment.

A clearance between conductive parts 26 for high-frequency shielding adjoining each other, which surrounds the respective conductive parts 22 for connection, is the same as in the anisotropically conductive connector 10 according to the second embodiment.

The anisotropically conductive connector 10 according to the seventh embodiment can be produced in accordance with the production process of the anisotropically conductive connector 10 according to the first embodiment.

According to the anisotropically conductive connector 10 according to the seventh embodiment, in addition to the conductive parts 22 for connection arranged in the respective functional parts 21 and to be electrically connected to electrodes that are an object of connection, a plurality of the conductive parts 26 for high-frequency shielding extending in the same direction as the conductive parts 22 for connection are arranged in the part 28 to be supported of the elastic anisotropically conductive film 20 in such a manner that they surround each of the conductive parts 22 for connection along a concentric circle with the conductive part 22 for connection, and further each of the conductive parts 26 for high-frequency shielding is electrically connected to the frame plate 11 having conductivity. So that both external noises to high-frequency signals and noises from adjoining conductive parts 22 for connection can be controlled in each of the conductive parts 22 for connection by connecting the frame plate 11 to a ground. Accordingly, expected electrical inspection as to a circuit device, which is an object of inspection, can be performed without being influenced by the noises even when the clock frequency of the circuit device is, for example, at least 1 GHz in the case where the anisotropically conductive connector 10 according to the seventh embodiment is used in the electrical inspection of the circuit device.

Figure 18:
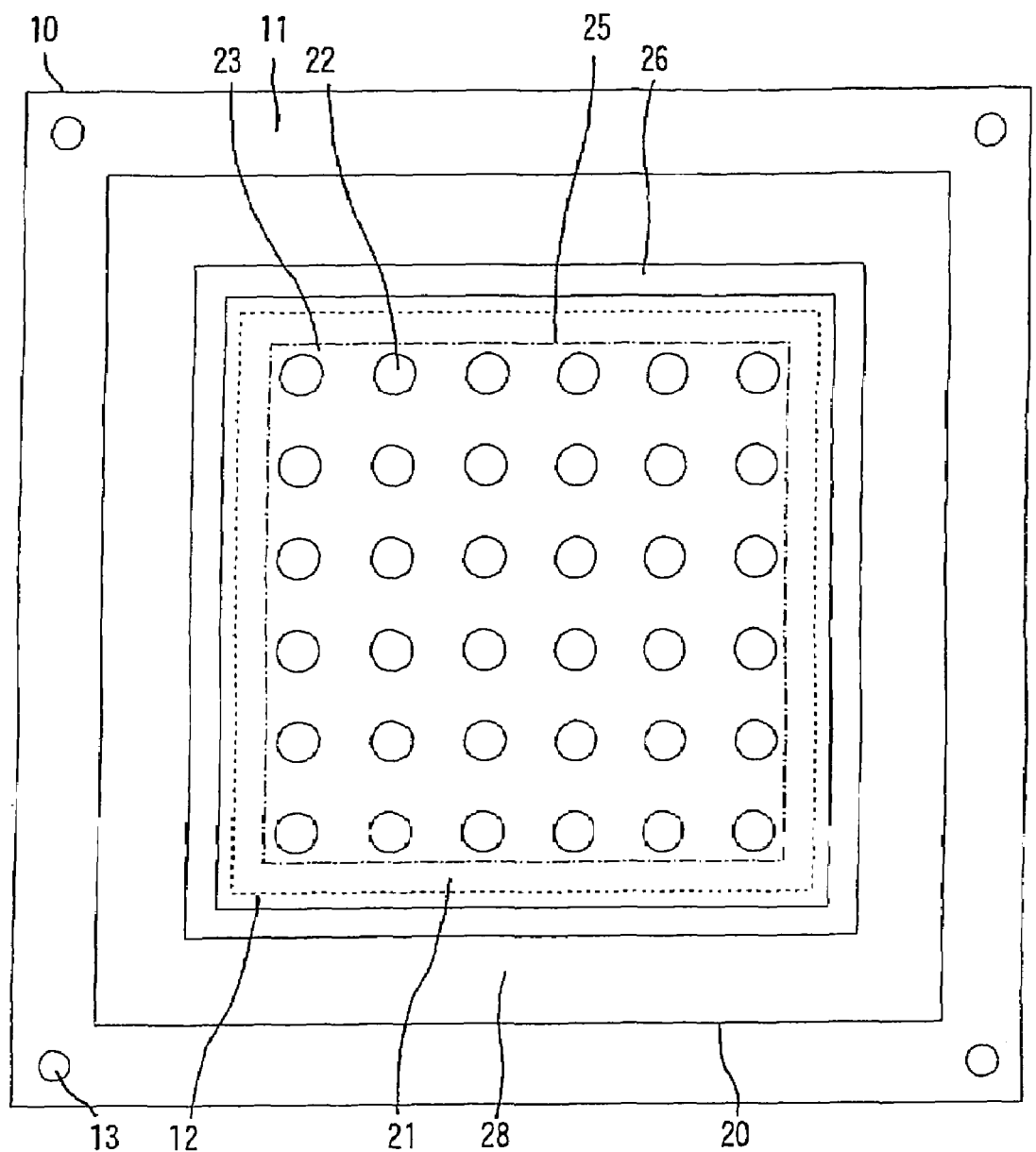
FIG. 18 is a plan view illustrating an anisotropically conductive connector according to an eighth embodiment of the present invention.
Figure 19:
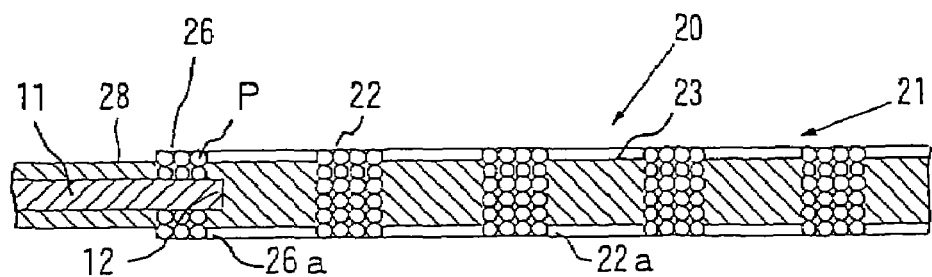
FIG. 19 is a cross-sectional view illustrating, on an enlarged scale, the construction of a principal part of the anisotropically conductive connector according to the eighth embodiment of the present invention.

FIG. 18 is a plan view illustrating an anisotropically conductive connector according to an eighth embodiment of the present invention, and FIG. 19 is a cross-sectional view illustrating, on an enlarged scale, the construction of a principal part of the anisotropically conductive connector according to the eighth embodiment.

The anisotropically conductive connector 10 according to the eighth embodiment has a frame plate 11 of the same construction as in the anisotropically conductive connector 10 according to the first embodiment, and an elastic anisotropically conductive film 20 having conductivity in a thickness-wise direction thereof is arranged on the opening 12 in this frame plate 11 in a state supported by an opening edge of the frame plate 11.

The elastic anisotropically conductive film 20 is composed of an elastic polymeric substance as a base material and has a functional part 21 composed of a plurality of conductive parts 22 for connection arranged in accordance with a pattern corresponding to a pattern of electrodes of a circuit device to be connected and each extending in the thickness-wise direction, and an insulating part 23 mutually insulating the respective conductive parts 22 for connection.

This functional part 21 is arranged so as to be located in the opening 12 in the frame plate 11. In this embodiment, each of the conductive parts 22 for connection has a columnar form and is arranged in accordance with positions of lattice points.

At a peripheral edge of the functional part 21, a part 28 to be supported, which is fixed and supported by being laminated on an opening edge of the frame plate 11, is formed integrally and continuously with the functional part 21. More specifically, the part 28 to be supported in this embodiment is shaped in a forked form and fixed and supported in a closely contacted state so as to grasp the opening edge in the frame plate 11. In this part 28 to be supported, a conductive part 26 for high-frequency shielding extending in the thickness-wise direction and electrically connected to the frame plate 11 is formed. The conductive part 26 for high-frequency shielding of this embodiment having a form of rectangular pipe, the size of a pipe hole of which is greater than the size of the opening 12 in the frame plate 11, is arranged in such a manner that a group 25 (indicated by an alternate long and short dash line in FIG. 18) of conductive parts including all the conductive parts 22 for connection in the functional part 21 is received in the pipe hole so as to surround the group 25 of conductive parts.

Projected parts 22a and 26a protruding from other surfaces than portions, at which the conductive parts 22 for connection and the conductive part 26 for high-frequency shielding are located, are formed at those portions on both surfaces of the elastic anisotropically conductive film 20.

As illustrated in FIG. 19, conductive particles P exhibiting magnetism are contained at a high density in the conductive parts 22 for connection in the functional part 21 and the conductive part 26 for high-frequency shielding in the part 28 to be supported of the elastic anisotropically conductive film 20 in a state oriented so as to align in the thickness-wise direction of the film. On the other hand, the insulating part 23 in the functional part 21 and portions other than the conductive part 26 for high-frequency shielding in the part 28 to be supported do not contain the conductive particles P at all or scarcely contain them.

In this anisotropically conductive connector 10 according to the eighth embodiment, as a material of the elastic polymeric substance for forming the elastic anisotropically conductive film and a material of the conductive particles P in the conductive parts 22 for connection and conductive part 26 for high-frequency shielding, may be used the same materials as those in the anisotropically conductive connector 10 according to the first embodiment.

The anisotropically conductive connector 10 according to the eighth embodiment can be produced in accordance with the production process of the anisotropically conductive connector 10 according to the first embodiment.

According to the anisotropically conductive connector 10 according to the eighth embodiment, in addition to the conductive parts 22 for connection arranged in the functional part 21 and to be electrically connected to electrodes that are an object of connection, the rectangular pipe-like conductive part 26 for high-frequency shielding extending in the same direction as the conductive parts 22 for connection is arranged in the part 28 to be supported of the elastic anisotropically conductive film 20 in such a manner that the group 25 of conductive parts including all the conductive parts 22 for connection is received in the pipe hole thereof, thereby surrounding the group 25 of conductive part, and further the conductive part 26 for high-frequency shielding is electrically connected to the frame plate 11 having conductivity. So that an external noise to high-frequency signals can be controlled in each of the conductive parts 22 for connection by connecting the frame plate 11 to a ground. Accordingly, expected electrical inspection as to a circuit device, which is an object of inspection, can be performed without being influenced by the noise even when the clock frequency of the circuit device is, for example, at least 1 GHz in the case where the anisotropically conductive connector 10 according to the eighth embodiment is used in the electrical inspection of the circuit device.

Figure 20:
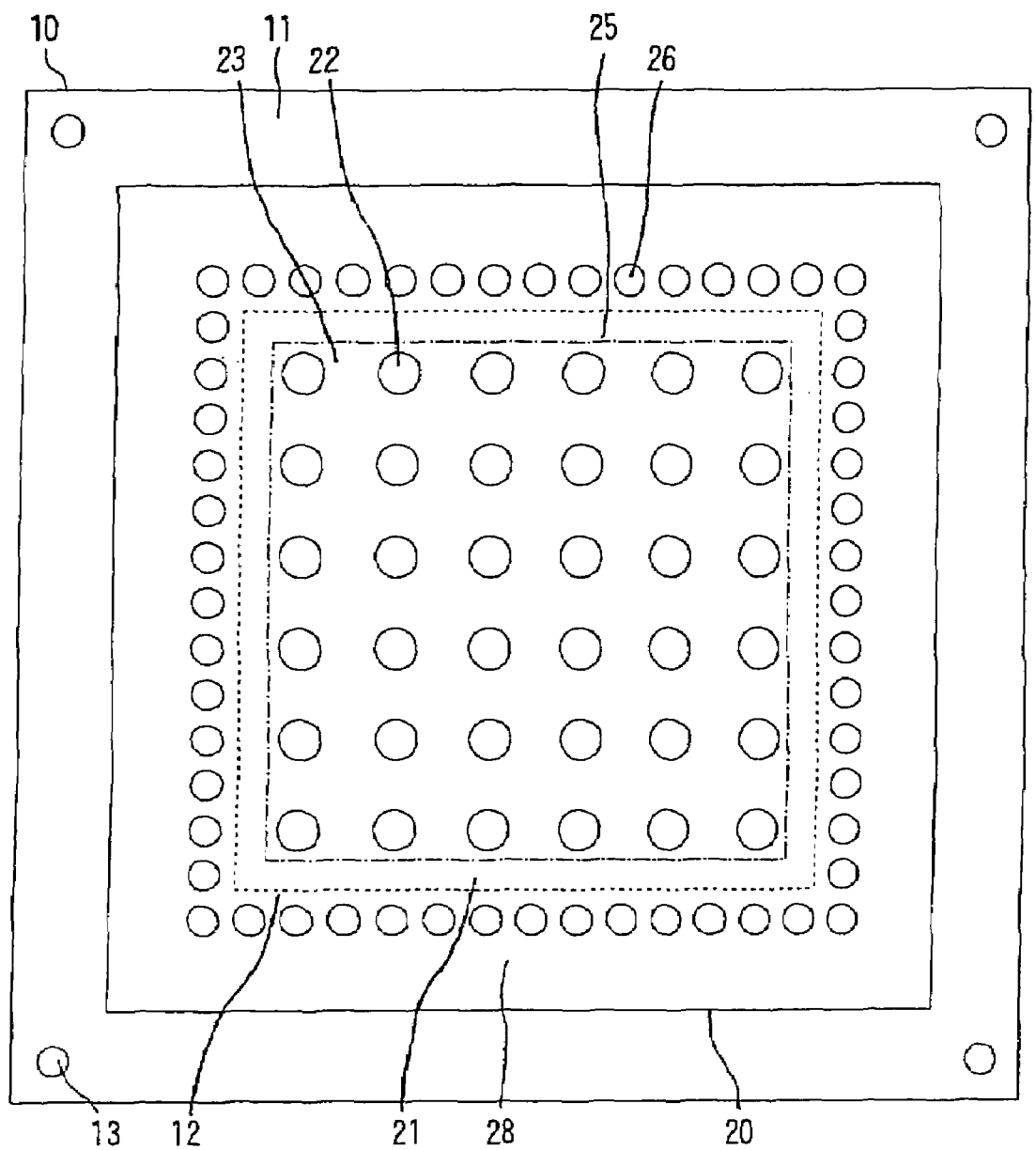
FIG. 20 is a plan view illustrating an anisotropically conductive connector according to a ninth embodiment of the present invention.
Figure 21:
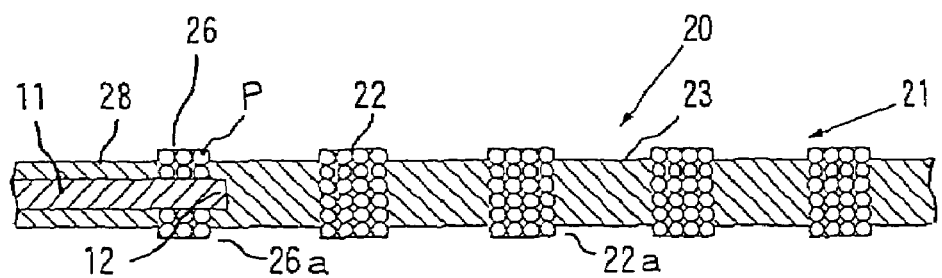
FIG. 21 is a cross-sectional view illustrating, on an enlarged scale, the construction of a principal part of the anisotropically conductive connector according to the ninth embodiment of the present invention.

FIG. 20 is a plan view illustrating an anisotropically conductive connector according to a ninth embodiment of the present invention, and FIG. 21 is a cross-sectional view illustrating, on an enlarged scale, the construction of a principal part of the anisotropically conductive connector according to the ninth embodiment.

The anisotropically conductive connector 10 according to the ninth embodiment has a frame plate 11 of the same construction as in the anisotropically conductive connector 10 according to the first embodiment, and an elastic anisotropically conductive film 20 having conductivity in a thickness-wise direction thereof is arranged on the opening 12 in this frame plate 11 in a state supported by an opening edge of the frame plate 11.

The elastic anisotropically conductive film 20 is composed of an elastic polymeric substance as a base material and has a functional part 21 composed of a plurality of conductive parts 22 for connection arranged in accordance with a pattern corresponding to a pattern of electrodes of a circuit device to be connected and each extending in the thickness-wise direction, and an insulating part 23 mutually insulating the respective conductive parts 22 for connection. The functional part 21 is arranged so as to be located in the opening 12 in the frame plate 11. In this embodiment, each of the conductive parts 22 for connection has a columnar form and is arranged in accordance with positions of lattice points.

At a peripheral edge of the functional part 21, a part 28 to be supported, which is fixed and supported by being laminated on an opening edge in the frame plate 11, is formed integrally and continuously with the functional part 21. More specifically, the part 28 to be supported in this embodiment is shaped in a forked form and fixed and supported in a closely contacted state so as to grasp the opening edge of the frame plate 11. In this part 28 to be supported, a plurality of columnar conductive parts 26 for high-frequency shielding each extending in the thickness-wise direction and electrically connected to the frame plate 11 are formed. In this embodiment, the respective conductive parts 26 for high-frequency shielding are arranged so as to surround a group 25 (indicated by an alternate long and short dash line in FIG. 20) of conductive parts including all the conductive parts 22 for connection in the functional part 21 along sides of a rectangle having a size greater than the size of the opening 12 in the frame plate 11.

Projected parts 22a and 26a protruding from other surfaces than portions, at which the conductive parts 22 for connection and the conductive parts 26 for high-frequency shielding are located, are formed at those portions on both surface of the elastic anisotropically conductive film 20.

As illustrated in FIG. 21, conductive particles P exhibiting magnetism are contained at a high density in the conductive parts 22 for connection in the functional part 21 and the conductive parts 26 for high-frequency shielding in the part 28 to be supported of the elastic anisotropically conductive film 20 in a state oriented so as to align in the thickness-wise direction of the film. On the other hand, the insulating part 23 in the functional part 21 and portions other than the conductive parts 26 for high-frequency shielding in the part 28 to be supported do not contain the conductive particles P at all or scarcely contain them.

In this anisotropically conductive connector 10 according to the ninth embodiment, as a material of the elastic polymeric substance for forming the elastic anisotropically conductive film and a material of the conductive particles P in the conductive parts 22 for connection and conductive parts 26 for high-frequency shielding, may be used the same materials as those in the anisotropically conductive connector 10 according to the first embodiment.

A clearance between conductive parts 26 for high-frequency shielding adjoining each other, which surround the group 25 of conductive parts, is the same as in the anisotropically conductive connector 10 according to the fourth embodiment.

The anisotropically conductive connector 10 according to the ninth embodiment can be produced in accordance with the production process of the anisotropically conductive connector 10 according to the first embodiment.

According to the anisotropically conductive connector 10 according to the ninth embodiment, in addition to the conductive parts 22 for connection arranged in the functional part 21 and to be electrically connected to electrodes that are an object of connection, the plurality of the conductive parts 26 for high-frequency shielding extending in the same direction as the conductive parts 22 for connection are arranged in the part 28 to be supported of the elastic anisotropically conductive film 20 so as to surround the group 25 of conductive parts including all the conductive parts 22 for connection, and further each of the conductive parts 26 for high-frequency shielding is electrically connected to the frame plate 11 having conductivity. So that an external noise to high-frequency signals can be controlled in each of the conductive parts 22 for connection by connecting the frame plate 11 to a ground. Accordingly, expected electrical inspection as to a circuit device, which is an object of inspection, can be performed without being influenced by the noise even when the clock frequency of the circuit device is, for example, at least 1 GHz in the case where the anisotropically conductive connector 10 according to the ninth embodiment is used in the electrical inspection of the circuit device.

Figure 22:
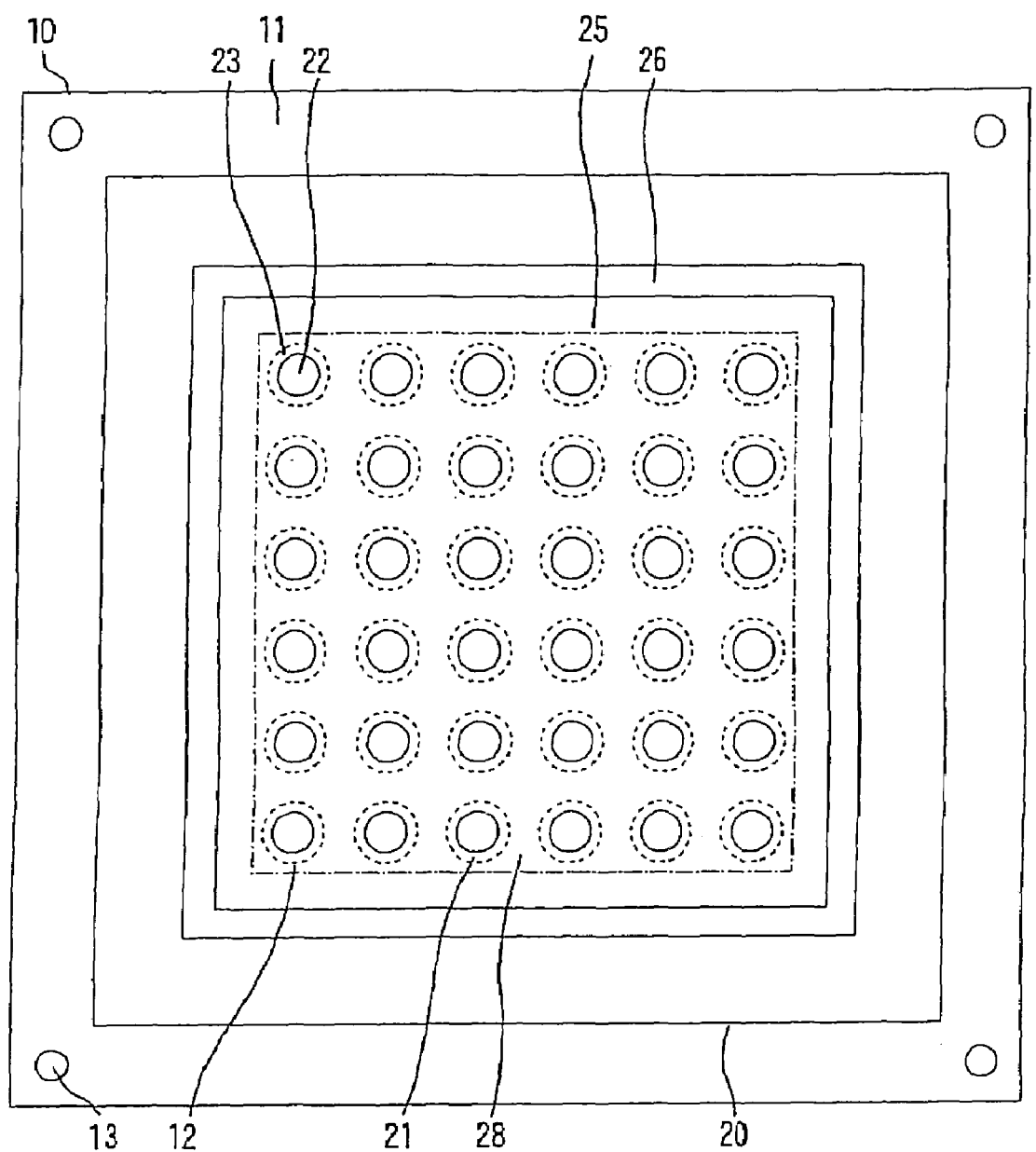
FIG. 22 is a plan view illustrating an anisotropically conductive connector according to a tenth embodiment of the present invention.
Figure 23:
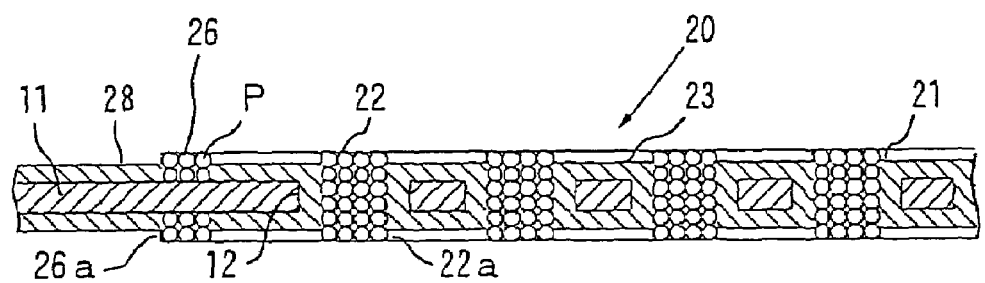
FIG. 23 is a cross-sectional view illustrating, on an enlarged scale, the construction of a principal part of the anisotropically conductive connector according to the tenth embodiment of the present invention.

FIG. 22 is a plan view illustrating an anisotropically conductive connector according to a tenth embodiment of the present invention, and FIG. 23 is a cross-sectional view illustrating, on an enlarged scale, the construction of a principal part of the anisotropically conductive connector according to the tenth embodiment.

The anisotropically conductive connector 10 according to the tenth embodiment has a frame plate 11 of the same construction as in the anisotropically conductive connector 10 according to the sixth embodiment, and a rectangular elastic anisotropically conductive film 20 having conductivity in a thickness-wise direction thereof is fixed to and supported by the frame plate 11.

The elastic anisotropically conductive film 20 is composed of an elastic polymeric substance as a base material and has a plurality of functional parts 21 each composed of a columnar conductive part 22 for connection extending in the thickness-wise direction, and an insulating part 23 formed integrally with a periphery of the conductive part 22 for connection. These functional parts 21 are arranged so as to be located in the respective openings 12 of the frame plate 11.

At the peripheral edge of each of the functional parts 21, a part 28 to be supported, which is fixed and supported by being laminated on both surfaces of the frame plate 11, is formed integrally and continuously with each of the functional parts 21. In this part 28 to be supported, a conductive part 26 for high-frequency shielding extending in the thickness-wise direction and electrically connected to the frame plate 11 is formed. The conductive part 26 for high-frequency shielding of this embodiment having a form of rectangular pipe, the size of a pipe hole of which is greater than the size of a group 25 (indicated by an alternate long and short dash line in FIG. 22) of conductive parts including all the conductive parts 22 for connection, is arranged in such a manner that the group 25 of conductive parts is received in the pipe hole so as to surround the group 25 of conductive parts. Projected parts 22a and 26a protruding from other surfaces than portions, at which the conductive parts 22 for connection and the conductive part 26 for high-frequency shielding are located, are formed at those portions on both surfaces of the elastic anisotropically conductive film 20.

As illustrated in FIG. 23, conductive particles P exhibiting magnetism are contained at a high density in the conductive part 22 for connection in each functional part 21 and the conductive part 26 for high-frequency shielding in the part 28 to be supported in the elastic anisotropically conductive film 20 in a state oriented so as to align in the thickness-wise direction of the film. On the other hand, the insulating part 23 in each functional part 21 and portions other than the conductive part 26 for high-frequency shielding in the part 28 to be supported do not contain the conductive particles P at all or scarcely contains them.

As a material of the elastic polymeric substance for forming the elastic anisotropically conductive film and a material of the conductive particles P in the conductive parts 22 for connection and conductive part 26 for high-frequency shielding in the anisotropically conductive connector 10 according to the tenth embodiment, may be used the same materials as those in the anisotropically conductive connector 10 according to the first embodiment.

The anisotropically conductive connector 10 according to the tenth embodiment can be produced in accordance with the production process of the anisotropically conductive connector 10 according to the first embodiment.

According to the anisotropically conductive connector 10 according to the tenth embodiment, in addition to the conductive parts 22 for connection arranged in the respective functional parts 21 and to be electrically connected to electrodes that are an object of connection, the rectangular pipe-like conductive part 26 for high-frequency shielding extending in the same direction as the conductive parts 22 for connection is arranged in the part 28 to be supported of the elastic anisotropically conductive film 20 in such a manner that the group 25 of conductive parts including all the conductive parts 22 for connection is received in the pipe hole thereof, thereby surrounding the group 25 of conductive part, and further the conductive part 26 for high-frequency shielding is electrically connected to the frame plate 11 having conductivity. So that an external noise to high-frequency signals can be controlled in each of the conductive parts 22 for connection by connecting the frame plate 11 to a ground. Accordingly, expected electrical inspection as to a circuit device, which is an object of inspection, can be performed without being influenced by the noises even when the clock frequency of the circuit device is, for example, at least 1 GHz in the case where the anisotropically conductive connector 10 according to the tenth embodiment is used in the electrical inspection of the circuit device.

Figure 24:
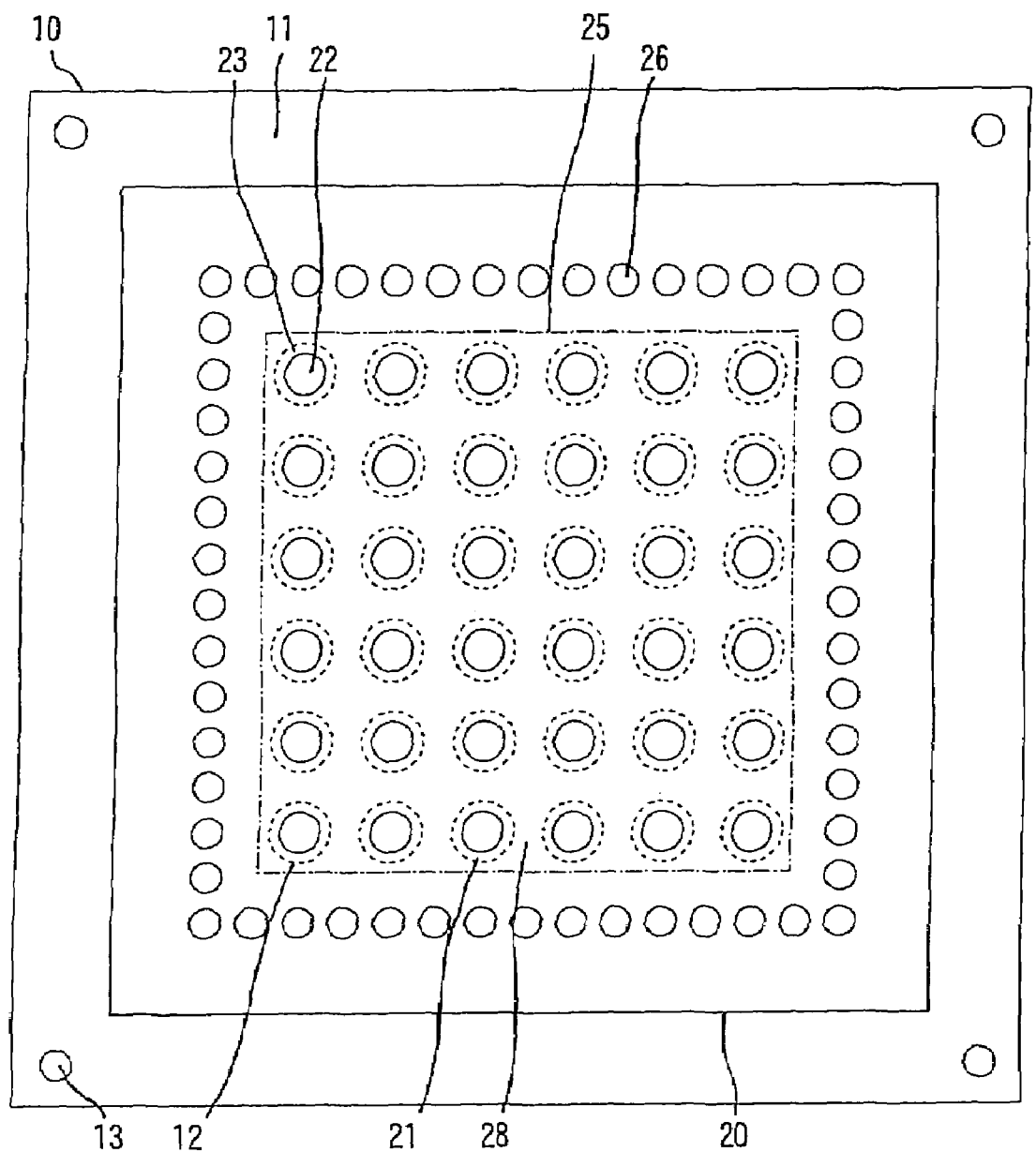
FIG. 24 is a plan view illustrating an anisotropically conductive connector according to an eleventh embodiment of the present invention.
Figure 25:
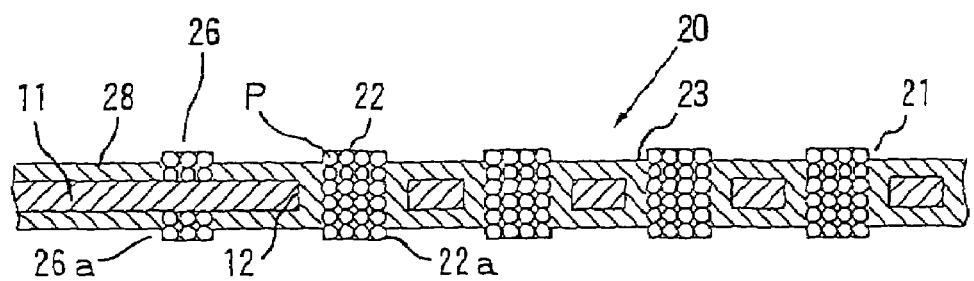
FIG. 25 is a cross-sectional view illustrating, on an enlarged scale, the construction of a principal part of the anisotropically conductive connector according to the eleventh embodiment of the present invention.

FIG. 24 is a plan view illustrating an anisotropically conductive connector according to an eleventh embodiment of the present invention, and FIG. 25 is a cross-sectional view illustrating, on an enlarged scale, the construction of a principal part of the anisotropically conductive connector according to the eleventh embodiment.

The anisotropically conductive connector 10 according to the eleventh embodiment has a frame plate 11 of the same construction as in the anisotropically conductive connector 10 according to the sixth embodiment, and a rectangular elastic anisotropically conductive film 20 having conductivity in a thickness-wise direction thereof is fixed to and supported by the frame plate 11.

The elastic anisotropically conductive film 20 is composed of an elastic polymeric substance as a base material and has a plurality of functional parts 21 each composed of a columnar conductive part 22 for connection extending in the thickness-wise direction, and an insulating part 23 formed integrally with a periphery of the conductive part 22 for connection. These functional parts 21 are arranged so as to be located in the respective openings 12 of the frame plate 11.

At the peripheral edge of each of the functional parts 21, a part 28 to be supported, which is fixed and supported by being laminated on both surfaces of the frame plate 11, is formed integrally and continuously with each of the functional parts 21. In this part 28 to be supported, a plurality of columnar conductive parts 26 for high-frequency shielding each extending in the thickness-wise direction and electrically connected to the frame plate 11 are formed. The respective conductive parts 26 for high-frequency shielding in this embodiment are arranged so as to surround a group 25 (indicated by an alternate long and short dash line in FIG. 24) of conductive parts including all the conductive parts 22 for connection in the functional parts 21 along sides of a rectangle having a size greater than the size of the group 25 of conductive parts.

Projected parts 22a and 26a protruding from other surfaces than portions, at which the conductive parts 22 for connection and the conductive parts 26 for high-frequency shielding are located, are formed at those portions on both surfaces of the elastic anisotropically conductive film 20.

As illustrated in FIG. 25, conductive particles P exhibiting magnetism are contained at a high density in the conductive part 22 for connection in each functional part 21 and the conductive parts 26 for high-frequency shielding in the part 28 to be supported in the elastic anisotropically conductive film 20 in a state oriented so as to align in the thickness-wise direction of the film. On the other hand, the insulating part 23 in each functional part 21 and portions other than the conductive parts 26 for high-frequency shielding in the part 28 to be supported do not contain the conductive particles P at all or scarcely contains them.

As a material of the elastic polymeric substance for forming the elastic anisotropically conductive film and a material of the conductive particles P in the conductive parts 22 for connection and conductive parts 26 for high-frequency in the anisotropically conductive connector 10 according to the eleventh embodiment, may be used the same materials as those in the anisotropically conductive connector 10 according to the first embodiment.

A clearance between conductive parts 26 for high-frequency shielding adjoining each other, which surround the group 25 of conductive parts, is the same as in the anisotropically conductive connector 10 according to the fourth embodiment.

The anisotropically conductive connector 10 according to the eleventh embodiment can be produced in accordance with the production process of the anisotropically conductive connector 10 according to the first embodiment.

According to the anisotropically conductive connector 10 according to the eleventh embodiment, in addition to the conductive parts 22 for connection arranged in the respective functional parts 21 and to be electrically connected to electrodes that are an object of connection, the plurality of the conductive parts 26 for high-frequency shielding extending in the same direction as the conductive parts 22 for connection are arranged in the part 28 to be supported of the elastic anisotropically conductive film 20 so as to surround the group 25 of conductive parts including all the conductive parts 22 for connection, and further each of the conductive parts 26 for high-frequency shielding is electrically connected to the frame plate 11 having conductivity. So that an external noise to high-frequency signals can be controlled in each of the conductive parts 22 for connection by connecting the frame plate 11 to a ground. Accordingly, expected electrical inspection on a circuit device, which is an object of inspection, can be performed without being influenced by the noises even when the clock frequency of the circuit device is, for example, at least 1 GHz in the case where the anisotropically conductive connector 10 according to the eleventh embodiment is used in the electrical inspection of the circuit device.

The anisotropically conductive connectors according to the present invention are not limited to the above-described first to eleventh embodiments, and various changes or modifications may be added thereto.

Figure 26:
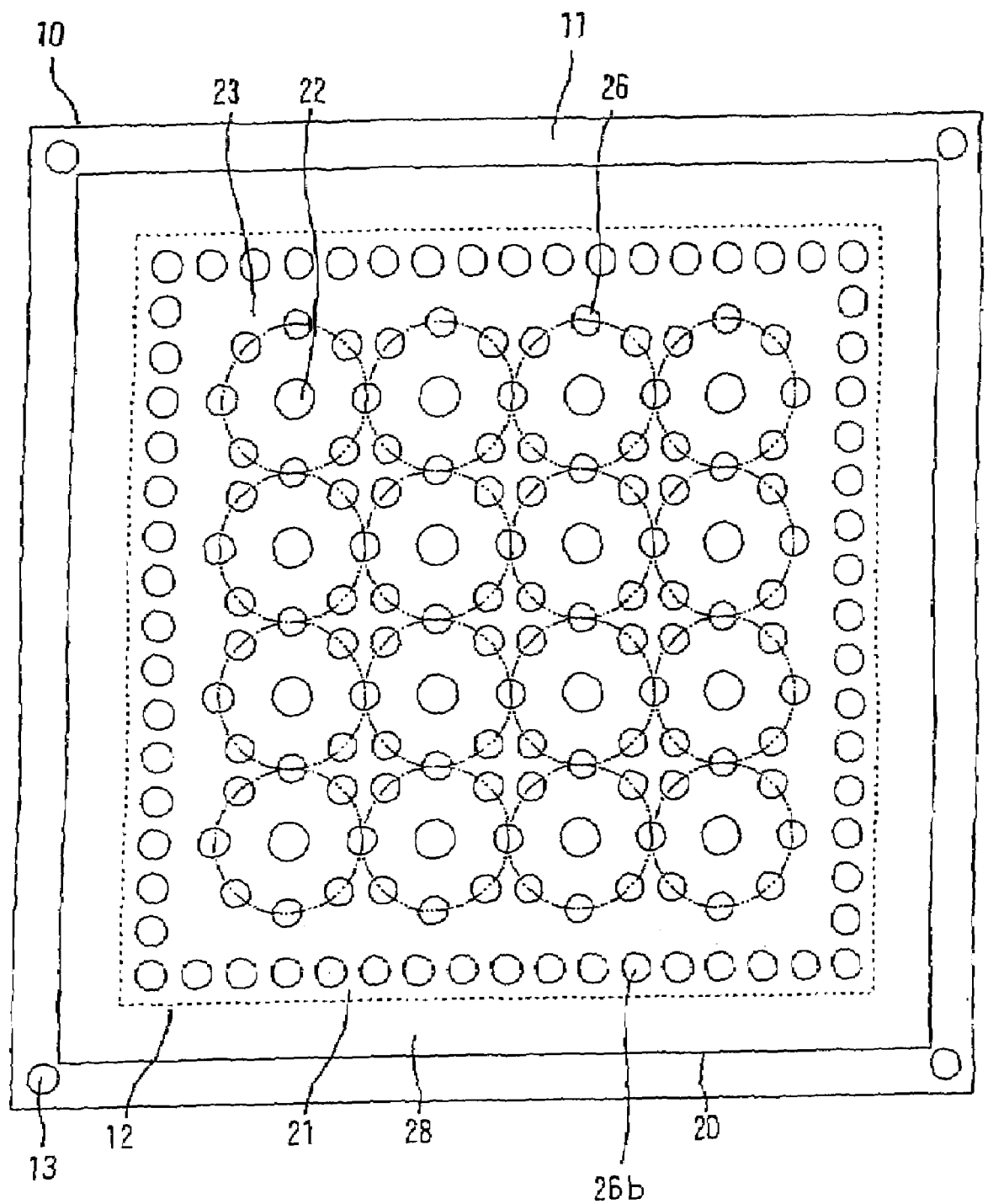
FIG. 26 is a plan view illustrating a modified example of the anisotropically conductive connector according to the present invention.
Figure 27:
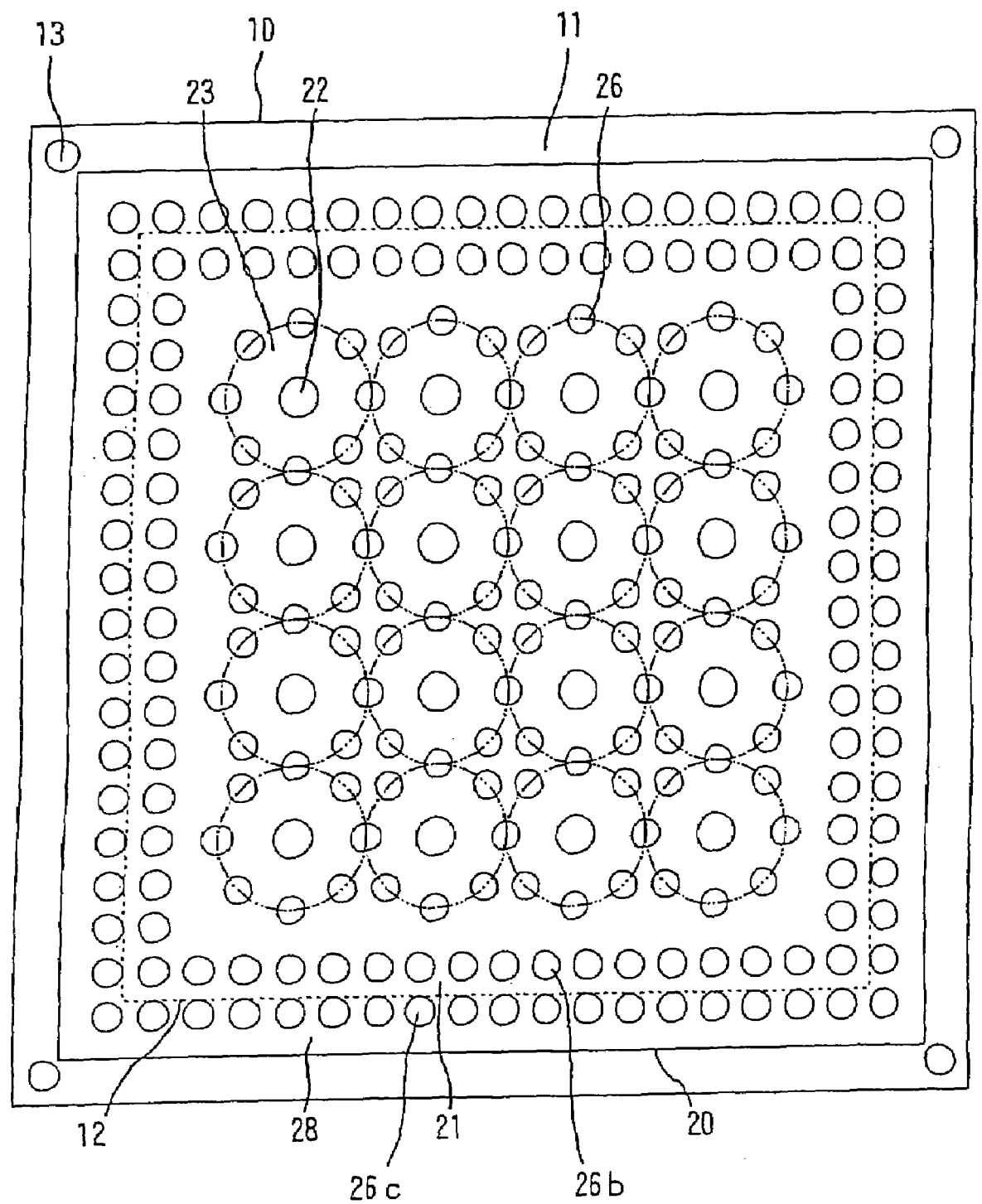
FIG. 27 is a plan view illustrating another modified example of the anisotropically conductive connector according to the present invention.

For example, in addition to conductive parts 26 for high-frequency shielding, which surround individual conductive parts 22 for connection, condutive parts 26b for high-frequency shielding, which surround a group of conductive parts including a plurality of conductive parts 22 for connections, may be additionally formed in the functional parts 21 of the elastic anisotropically conductive film 20 as illustrated in FIG. 26. In addition to conductive parts 26, 26b for high-frequency shielding formed in the functional part 21, conductive parts 26c for high-frequency shielding, which surround a group of conductive parts inciuding a plurality of conductive parts 22 for connection, may be additionally formed in the part 28 to be supported as illustrated in FIG. 27.

Figure 28:
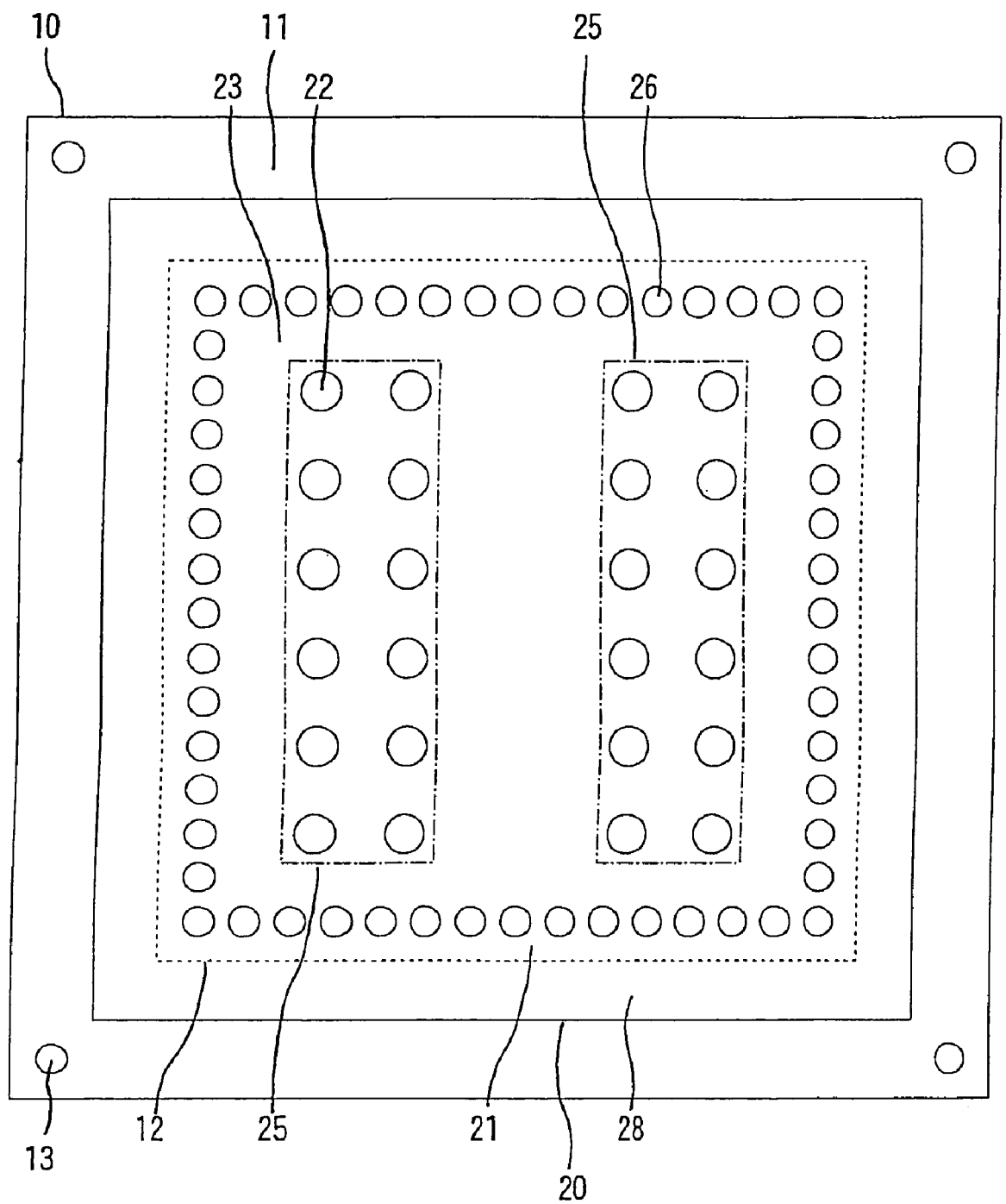
FIG. 28 is a plan view illustrating a further modified example of the anisotropically conductive connector according to the present invention.
Figure 29:
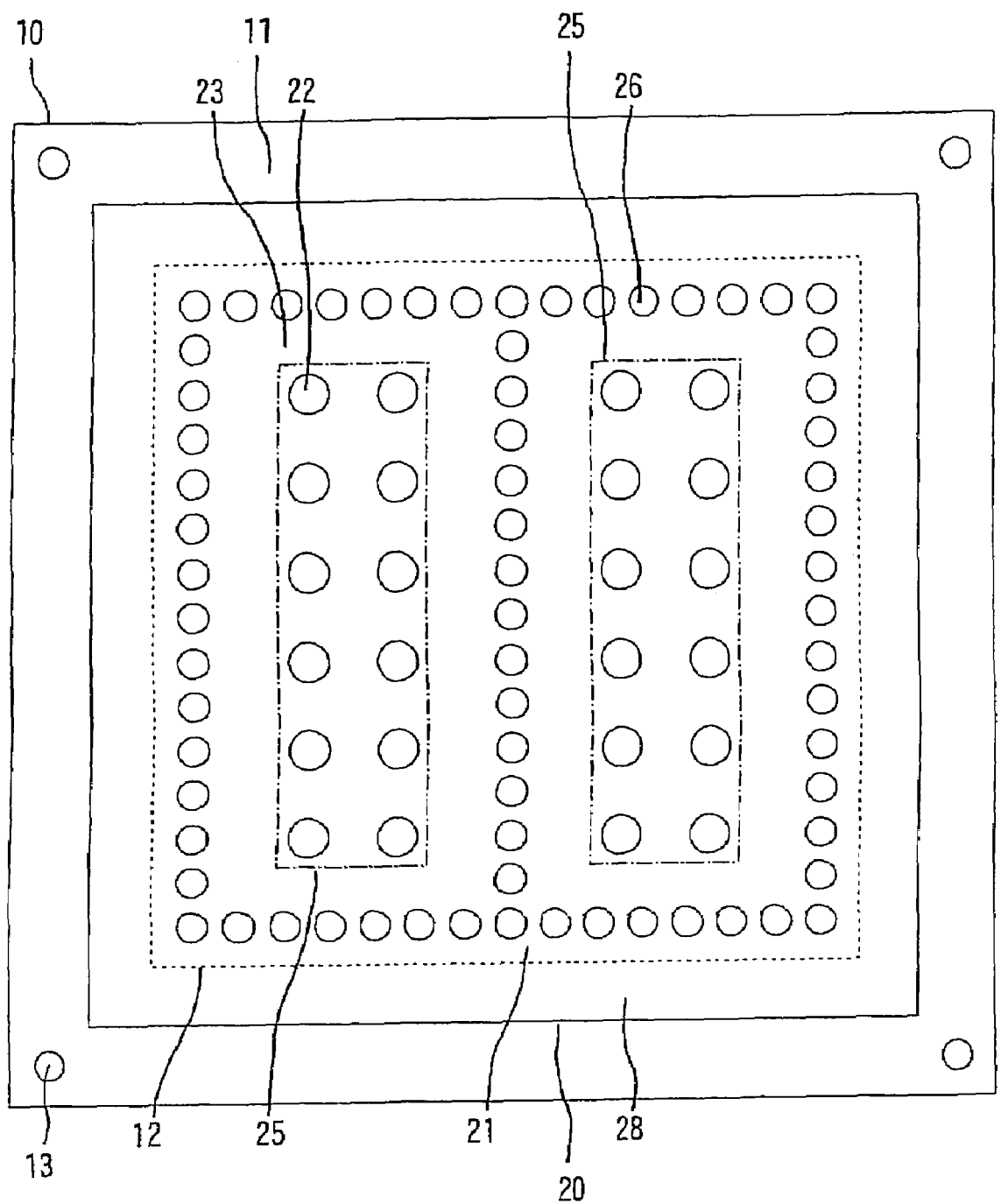
FIG. 29 is a plan view illustrating a still further modified example of the anisotropically conductive connector according to the present invention.

As illustrated in FIG. 28, when plural groups 25 (indicated by an alternate long and short dash line in FIG. 28) of conductive parts each including a plurality of conductive parts 22 for connection are formed at apart from each other in the functional part 21, the conductive parts 26 for high-frequency shielding may be formed so as to surround all the groups 25 of conductive parts or as illustrated in FIG. 29, the conductive parts 26 for high-frequency shielding may also be formed so as to surround the individual group 25 of conductive parts.

The application of the anisotropically conductive connectors according to the present invention is not limited to the electrical inspection of circuit devices, and they may also be useful as connectors used for mounting electronic parts on printed wiring boards.

[Electrical Inspection Apparatus for Circuit Device]

Figure 30:
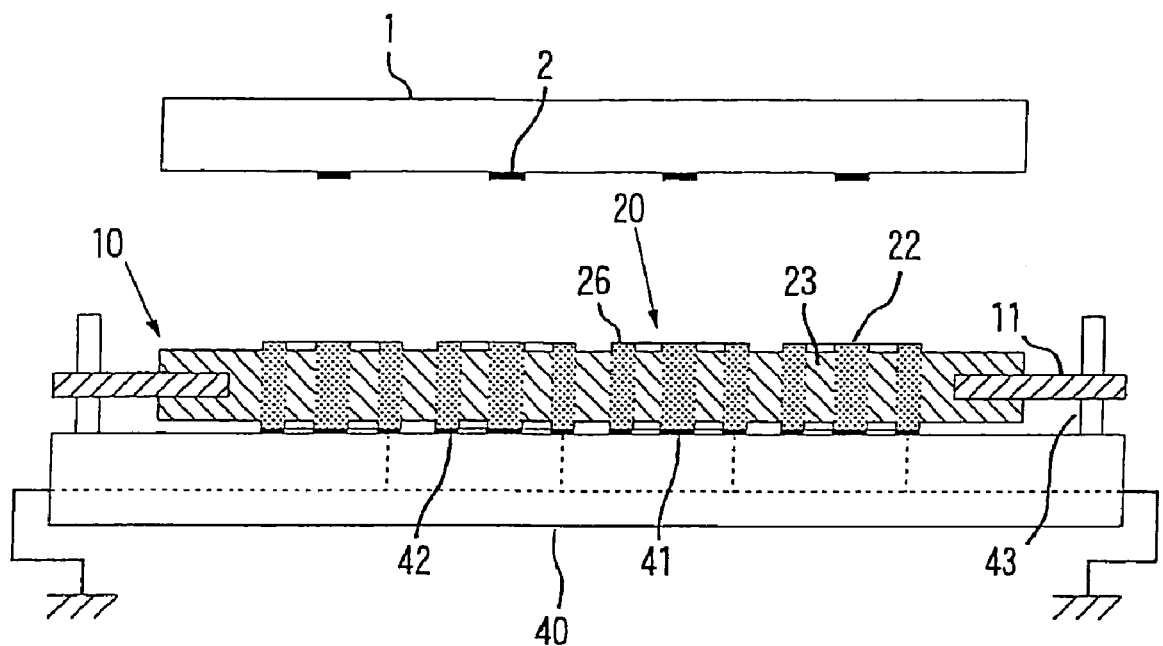
FIG. 30 illustrates the construction of an electrical inspection apparatus for circuit devices according to a first embodiment of the present invention.

FIG. 30 illustrates the construction of an electrical inspection apparatus according to a first embodiment of the present invention for circuit boards. This electrical inspection apparatus for circuit devices has a rectangular circuit board 40 for inspection and the anisotropically conductive connector 10 according to the first embodiment, which is arranged on a front surface of the circuit board 40 for inspection.

On the front surface of the circuit board 40 for inspection, a plurality of circular inspection electrodes 41 are arranged in accordance with a pattern corresponding to a pattern of electrodes 2 to be inspected of a circuit device 1 that is an object of inspection, and a plurality of ring-like grounding electrodes 42 are arranged in accordance with a pattern corresponding to a pattern of the conductive parts 26 for high-frequency shielding in the anisotropically conductive connector 10. Specifically, each of the grounding electrodes 42 is arranged by being located concentrically with one inspection electrode 41 so as to surround the inspection electrode 41. The inspection electrodes 41 are electrically connected to a tester (not illustrated), while the grounding electrodes 42 are connected to a ground. Guide pins 43 each extending upward from the front surface of the circuit board 40 for inspection are formed at positions of 4 corners on the front surface of the circuit board 40 for inspection.

The guide pins 43 of the circuit board 40 for inspection are inserted into the positioning holes 13 in the frame plate 11 in the anisotropically conductive connector 10, whereby the anisotropically conductive connector 10 is arranged on and fixed to the front surface of the circuit board 40 for inspection in a state that the conductive parts 22 for connection in the elastic anisotropically conductive film 20 have been located on the inspection electrodes 41, and the conductive parts 26 for high-frequency shielding have been located on the grounding electrodes 42.

In such an electrical inspection apparatus for circuit devices, the circuit device 1 is arranged on the anisotropically conductive connector 10 in such a manner that the electrodes 2 to be inspected are located on the conductive parts 22 for connection. In this state, for example, the circuit device 1 is pressed downward, whereby each of the conductive parts 22 for connection in the anisotropically conductive connector 10 is held and pressurized by the electrode 2 to be inspected and the inspection electrode 41, thereby forming a conductive path in the conductive part 22 for connection in a thickness-wise direction thereof. As a result, electrical connection between each of the electrodes 2 to be inspected of the circuit device 1 and each of the inspection electrodes 41 of the circuit board 40 for inspection is achieved. In this state, necessary electrical inspection for the circuit device 1 is performed.

Examples of the circuit device 1 that is the object of inspection include semiconductor integrated circuit devices such as packaged IC and MCM, wafers, on which integrated circuits have been formed, printed circuit boards for making up the semiconductor integrated circuit devices, and printed circuit boards for mounting the semiconductor integrated circuit devices.

According to such an electrical inspection apparatus for circuit devices, the anisotropically conductive connector according to the first embodiment is provided, and each of the conductive parts 26 for high-frequency shielding in the anisotropically conductive connector 10 is connected to a ground through the grounding electrode 42 in the circuit board 40 for inspection, so that both external noises to high-frequency signals and noises from adjoining conductive parts 22 for connection can be controlled in each of the conductive parts 22 for connection of the anisotropically conductive connector 10. Accordingly, expected electrical inspection as to the circuit device 1, which is the object of inspection, can be performed without being influenced by the noises even when the clock frequency of the circuit device 1 is, for example, at least 1 GHz.

Figure 31:
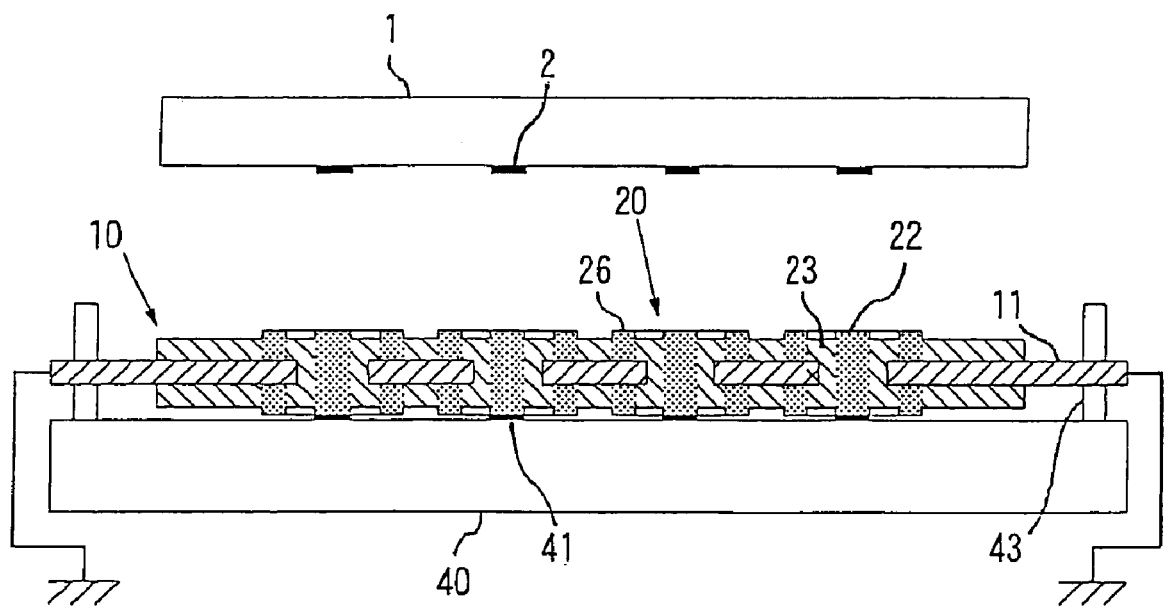
FIG. 31 illustrates the construction of an electrical inspection apparatus for circuit devices according to a second embodiment of the present invention.

FIG. 31 illustrates the construction of an electrical inspection apparatus according to a second embodiment of the present invention for circuit devices. This electrical inspection apparatus for circuit devices has a rectangular circuit board 40 for inspection and the anisotropically conductive connector 10 according to the sixth embodiment, which is arranged on a front surface of the circuit board 40 for inspection.

On the front surface of the circuit board 40 for inspection, a plurality of circular inspection electrodes 41 are arranged in accordance with a pattern corresponding to a pattern of electrodes 2 to be inspected of a circuit device 1 that is an object of inspection. These inspection electrodes 41 are electrically connected to a tester (not illustrated). Guide pins 43 each extending upward from the front surface of the circuit board 40 for inspection are formed at positions of 4 corners on the front surface of the circuit board 40 for inspection. The guide pins 43 of the circuit board 40 for inspection are inserted into the positioning holes 13 in the frame plate 11 in the anisotropically conductive connector 10, whereby the anisotropically conductive connector 10 is arranged on and fixed to the front surface of the circuit board 40 for inspection in a state that the conductive parts 22 for connection in the elastic anisotropically conductive film 20 have been located on the inspection electrodes 41.

The frame plate 11 in the anisotropically conductive connector 10 is connected to a ground.

In such an electrical inspection apparatus for circuit devices, the circuit device 1 is arranged on the anisotropically conductive connector 10 in such a manner that the electrodes 2 to be inspected are located on the conductive parts 22 for connection. In this state, for example, the circuit device 1 is pressed downward, whereby each of the conductive parts 22 for connection in the anisotropically conductive connector 10 is held and pressurized by the electrode 2 to be inspected and the inspection electrode 41, thereby forming a conductive path in the conductive part 22 for connection in a thickness-wise direction thereof. As a result, electrical connection between each of the electrodes 2 to be inspected of the circuit device 1 and each of the inspection electrodes 41 of the circuit board 40 for inspection is achieved. In this state, necessary electrical inspection for the circuit device 1 is performed. In this embodiment, the circuit device 1 that is the object of inspection is the same as in the electrical inspection apparatus illustrated in FIG. 30 for circuit devices.

According to such an electrical inspection apparatus for circuit devices, the anisotropically conductive connector 10 according to the sixth embodiment is provided, and each of the conductive parts 26 for high-frequency shielding in the anisotropically conductive connector 10 is connected to a ground through the frame plate 11, so that both external noises to high-frequency signals and noises from adjoining conductive parts 22 for connection can be controlled in each of the conductive parts 22 for connection of the anisotropically conductive connector 10. Accordingly, expected electrical inspection as to the circuit device 1, which is the object of inspection, can be performed without being influenced by the noises even when the clock frequency of the circuit device 1 is, for example, at least 1 GHz.

The electrical inspection apparatus according to the present invention for circuit devices are not limited to the above-described embodiments, and various changes or modifications may be added thereto.

For example, in the electrical inspection apparatus illustrated in FIG. 30 for circuit devices, any one of the anisotropically conductive connectors according to the second to fifth embodiments and the anisotropically conductive connectors illustrated in FIG. 26 to FIG. 29 may be used in place of the anisotropically conductive connector 10 according to the first embodiment. In this case, it is only necessary to arrange the grounding electrodes 42 in the circuit board 40 for inspection in accordance with a pattern corresponding to a pattern of the conductive parts for high-frequency shielding formed in the functional part of the elastic anisotropically conductive film in the anisotropically conductive connector used. In the case where the anisotropically conductive connector illustrated in FIG. 27 is used, the frame plate 11 is preferably connected to a ground.

In addition, in the electrical inspection apparatus illustrated in FIG. 31 for circuit devices, any one of the anisotropically conductive connectors according to the seventh to eleventh embodiments may be used in place of the anisotropically conductive connector 10 according to the sixth embodiment.

Figure 32:
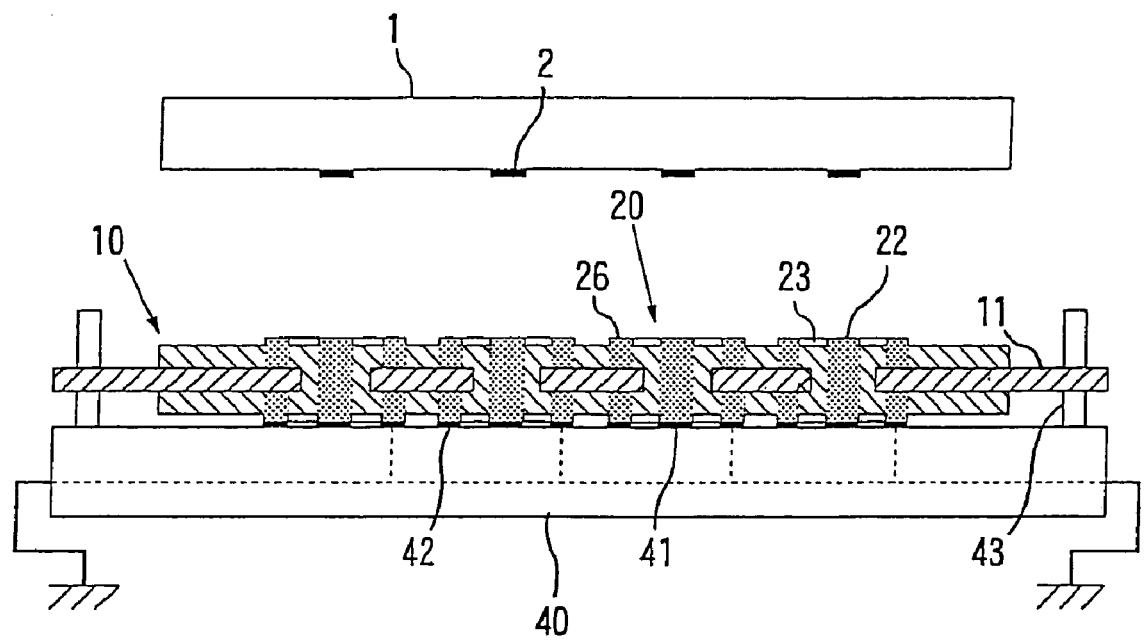
FIG. 32 illustrates the construction of a modified example of the electrical inspection apparatus for circuit devices according to the present invention.
Figure 33:
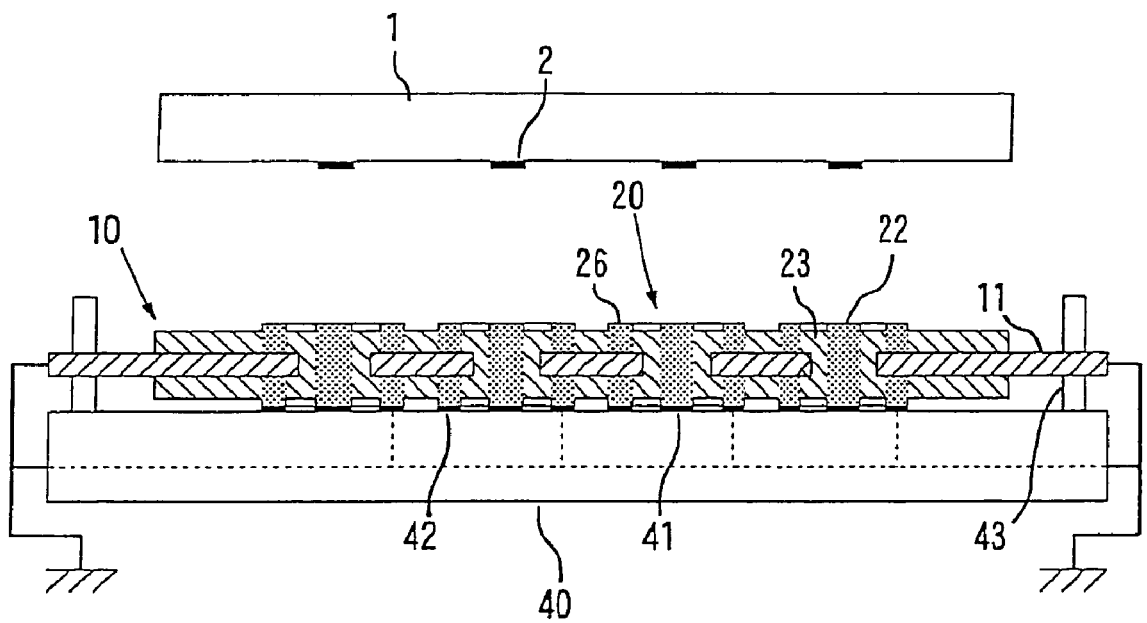
FIG. 33 illustrates the construction of another modified example of the electrical inspection apparatus for circuit devices according to the present invention.

In the electrical inspection apparatus illustrated in FIG. 30 for circuit devices, the anisotropically conductive connector 10 according to the sixth embodiment may be used in place of the anisotropically conductive connector 10 according to the first embodiment. In such construction, only the grounding electrodes 42 in the circuit board 40 for inspection may be connected to a ground as illustrated in FIG. 32. However, it is preferable that both grounding electrodes 42 and frame plate 11 be electrically connected to a ground.

The present invention will hereinafter be described specifically by the following Examples. However, the present invention is not limited to the following Examples.

EXAMPLE 1

An anisotropically conductive connector (10) according to the present invention was produced under the following conditions in accordance with the construction illustrated in FIG. 14 and FIG. 15.

[Frame Plate (11)]

A frame plate of the following specification was produced.

Material: Stainless steel (JIS Standard Code: SUS304), dimensions: 10 mm×10 mm×0.1 mm, diameter of opening (12): 500 μm, the number of openings (12): 16 (4×4), arrangement pitch of openings (12): 1 mm.

[Mold for Molding Elastic Anisotropically Conductive Film]

A mold for molding an elastic anisotropically conductive film composed of a top force (30) and a bottom force (35) of the following specification was produced in accordance with the construction illustrated in FIG. 3.

Ferromagnetic base plates (31, 36):
  Material: steel material (JIS Standard Code: SS400),
  Thickness: 6 mm.

Ferromagnetic substance layers (32, 37):
  Material: nickel,
  Diameter: 300 μm,
  Thickness: 50 μm,
  Number: 16 (4×4),
  Arrangement pitch: 1 mm.

Ferromagnetic substance layers (33, 38):
  Material: nickel,
  Inner diameter: 600 μm,
  Outer diameter: 800 μm,
  Thickness: 50 μm, Number: 16 (4×4), Arrangement pitch: 1 mm.

Non-magnetic substance layers (34, 39):

Material: cured product of dry film resist,

Thickness: 100 μm.

[Spacers (15, 16)]

Two spacers (15, 16) each composed of stainless steel (JIS Standard Code: SUS304) and having a thickness of 100 μm and an opening of 7.5 mm×7.5 mm were produced

[Formation of Elastic Anisotropically Conductive Film]

Eighty parts by weight of conductive particles having an average particle diameter of 30 μm were added to and mixed with 100 parts by weight of addition type liquid silicon rubber. Thereafter, the resultant mixture was subjected to a defoaming treatment by pressure reduction, thereby preparing a molding material for molding an elastic anisotropically conductive film. In the above-described process, those (average coating amount: 8% of the weight of core particles) obtained by plating core particles composed of nickel with gold were used as the conductive particles.

The molding material prepared was applied to the respective molding surfaces of the top force (30) and bottom force (35) in the mold described above by screen printing, and the frame plate (11) was arranged in alignment on the coating layer of the molding material formed on the molding surface of the bottom force (35) through the spacer (16). Further, the top force (30), on which the coating layer of the molding material had been formed, was arranged in alignment on the frame plate (11) through the spacer (15), thereby forming a molding material layer in a molding cavity between the top force (30) and the bottom force (35).

Electromagnets were arranged on an upper surface of the ferromagnetic base plate (31) of the top force (30) and a lower surface of the ferromagnetic base plate (36) of the bottom force (35), and the electromagnets are operated, whereby a magnetic field of 1.3 T was applied to the molding material layer in a thickness-wise direction thereof at portions located between the ferromagnetic substance layers (32, 33) of the top force (30) and the ferromagnetic substance layers (37, 38) of the bottom force (35). In this state, the molding material layer was subjected to a curing treatment under conditions of 100° C. for 1 hour, thereby forming an elastic anisotropically conductive film (20) in the frame plate (11) to produce an anisotropically conductive connector (10) according to the present invention.

In the elastic anisotropically conductive film (20) in the anisotropically conductive connector (10) thus obtained, 16 (4×4) conductive parts (22) for connection are formed, and a center distance (pitch) between adjacent conductive parts (22) for connection is 1 mm. Each of the conductive parts (22) for connection is such that the diameter is 300 μm, the thickness is 400 μm, and the projected heights from both surfaces of the insulating part (23) are each 50 μm. Each of the conductive parts (26) for high-frequency shielding is such that the inner diameter is 600 μm, the outer diameter is 800 μm, the thickness is 400 μm, and the projected heights from both surfaces of the insulating part (23) are each 50 μm. The thickness of the insulating part (23) is 300 μm.

The proportion of the conductive particles in the conductive parts (22) for connection was 25% in terms of a volume fraction, while the proportion of the conductive particles in the conductive parts (26) for high-frequency shielding was 25% in terms of a volume fraction.

[Circuit Board for Inspection]

A circuit board (40) for inspection of the following specification was produced in accordance with the construction illustrated in FIG. 32.

Inspection electrodes (41) each have a diameter of 300 μm, the number thereof is 16 (4×4), and the arrangement pitch thereof is 1 mm. Grounding electrodes (42) each have an inner diameter of 600 μm and an outer diameter of 800 μm, the number thereof is 16 (4×4), and the arrangement pitch thereof is 1 mm. This circuit board (40) for inspection has an external leading terminal (not illustrated) electrically connected to the inspection electrodes, and impedances Z of each circuit formed between the inspection electrodes (41) and the external leading terminal, and a probe cable for measurement connected to the external leading terminal are each designed to be 50 Ω.

[Evaluation of Anisotropically Conductive Connector]

The circuit board for inspection described above was used to evaluate the anisotropically conductive connector described above in the following manner.

A pulse generator was electrically connected to the leading terminal of the circuit board for inspection through a probe cable for measurement, and a terminal for measurement of an oscilloscope was brought into contact under pressure with an inspection electrode of the circuit board for inspection. In this state, an electric signal having a preset voltage of 2 V and a frequency shown in the following Table 1 was supplied to the external leading terminal of the circuit board for inspection by the pulse generator to detect an electric signal output from the inspection electrode of the circuit board for inspection by the oscilloscope. In the waveform of the electric signal detected, a time required until the voltage reached a value of 90% (1.8 V) of the preset voltage from a value of 10% (0.2 V) of the preset voltage was measured. This time is referred to as "$T_0$".

On the other hand, the anisotropically conductive connector was arranged in alignment on the circuit board for inspection, the pulse generator was electrically connected to the leading terminal of the circuit board for inspection through the probe cable for measurement, and the terminal for measurement of the oscilloscope was brought into contact under pressure with a conductive part for connection of the anisotropically conductive connector in such a manner that the distortion factor of the conductive part was 20%. In this state, an electric signal having a preset voltage of 2 V and a frequency shown in the following Table 1 was supplied to the external leading terminal of the circuit board for inspection by the pulse generator to detect an electric signal output from the conductive part for connection of the anisotropically conductive connector by the oscilloscope. In the waveform of the electric signal detected, a time required until the voltage reached a value of 90% (1.8 V) of the preset voltage from a value of 10% (0.2 V) of the preset voltage was measured. This time is referred to as "$T_1$".

A value of $(T_1-T_0)/T_0$ was then calculated out to rank the anisotropically conductive connector as A where this value was smaller than 0.05, B where this value was from 0.05 to 0.2, or C where this value exceeded 0.2.

In this test, when the value of $(T_1-T_0)/T_0$ exceeds 0.2, a transmission loss is great, so that it is difficult in fact to conduct a test for high-frequency properties.

The determination of the value of $(T_1-T_0)/T_0$ was conducted under the following Condition 1 to Condition 3.

Condition 1:

The frame plate of the anisotropically conductive connector is connected to a ground, and the grounding electrode of the circuit board for inspection is not connected to a ground.

Condition 2:

The frame plate of the anisotropically conductive connector is not connected to a ground, but the grounding electrode of the circuit board for inspection is connected to a ground.

Condition 3:

Both frame plate of the anisotropically conductive connector and grounding electrode of the circuit board for inspection are connected to a ground.

The results are shown in the following Table 1.

Comparative Example 1

Figure 34:
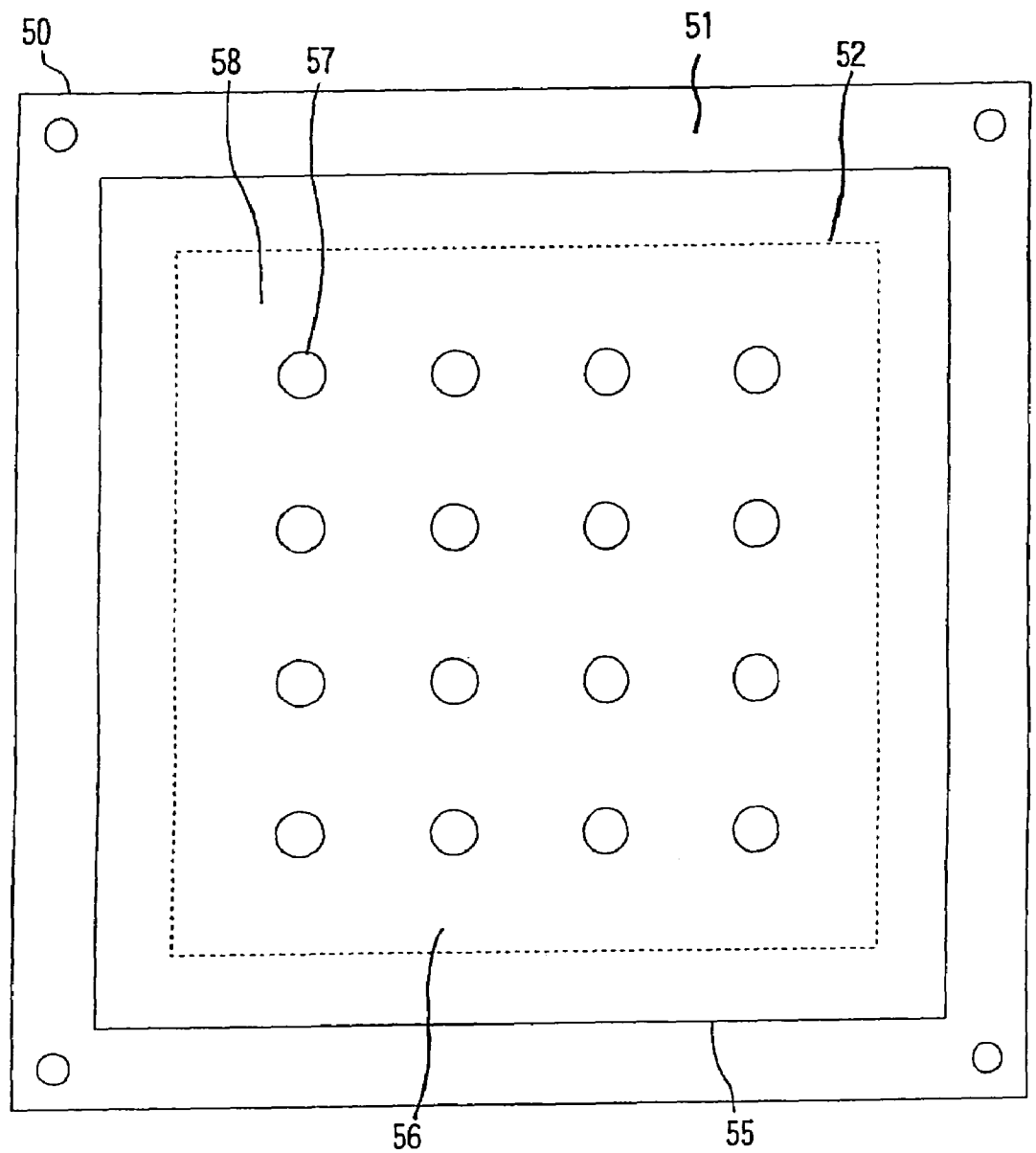
FIG. 34 is a plan view illustrating the construction of an anisotropically conductive connector produced in Comparative Example 1.
Figure 35:
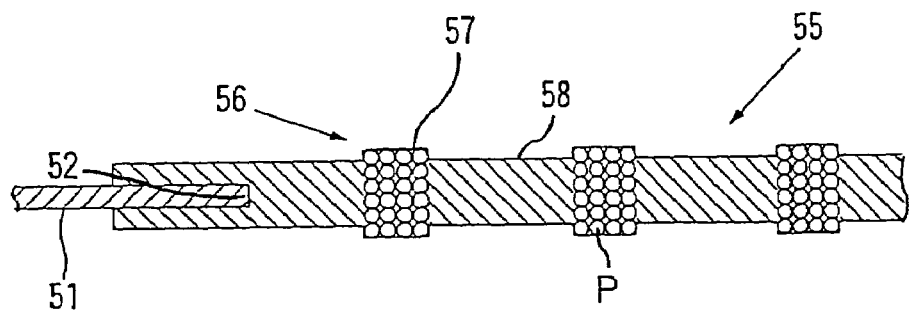
FIG. 35 is a cross-sectional view illustrating, on an enlarged scale, the construction of a principal part of the anisotropically conductive connector produced in Comparative Example 1.

A comparative anisotropically conductive connector (50) was produced under the following conditions in accordance with the construction illustrated in FIG. 34 and FIG. 35.

[Frame Plate (51)]

A frame plate (51) of the following specification was produced.

Material: Stainless steel (JIS Standard Code: SUS304), dimensions: 10 mm×10 mm×0.1 mm, dimensions of opening (52): 5.5 mm×5.5 mm.

[Mold for Molding Elastic Anisotropically Conductive Film]

Figure 36:
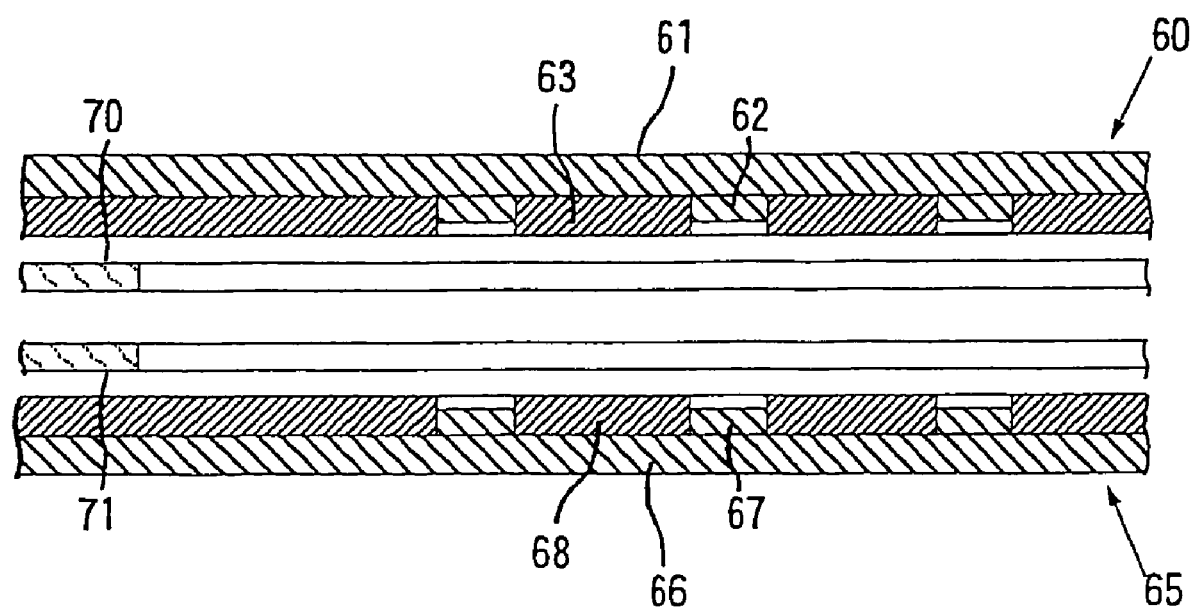
FIG. 36 is a cross-sectional view illustrating, on an enlarged scale, a principal part of a mold for molding of an elastic anisotropically conductive film used in Comparative Example 1.

A mold for molding an elastic anisotropically conductive film composed of a top force (60) and a bottom force (65) of the following specification was produced in accordance with the construction illustrated in FIG. 36.

Ferromagnetic base plates (61, 66):
    Material: steel material (JIS Standard Code: SS400),
    Thickness: 6 mm.

Ferromagnetic substance layers (62, 67):
    Material: nickel,
    Diameter: 300 μm,
    Thickness: 50 μm,
    Number: 16 (4×4),
    Arrangement pitch: 1 mm.

Non-magnetic substance layers (63, 68):
    Material: cured product of dry film resist,
    Thickness: 100 μm.

[Spacers (70, 71)]

Two spacers (70, 71) each composed of stainless steel (JIS Standard Code: SUS304) and having a thickness of 100 μm and an opening of 7.5 mm×7.5 mm were produced.

[Formation of Elastic Anisotropically Conductive Film]

Fifty three parts by weight of conductive particles having an average particle diameter of 30 μm were added to and mixed with 100 parts by weight of addition type liquid silicon rubber. Thereafter, the resultant mixture was subjected to a defoaming treatment by pressure reduction, thereby preparing a molding material for molding an elastic anisotropically conductive film. In the above-described process, those (average coating amount: 10% of the weight of core particles) obtained by plating core particles composed of nickel with gold were used as the conductive particles.

The molding material prepared was applied to the respective molding surfaces of the top force (60) and bottom force (65) in the mold described above by screen printing, and the frame plate (51) was arranged in alignment on the coating layer of the molding material formed on the molding surface of the bottom force (65) through the spacer (71). Further, the top force (60), on which the coating layer of the molding material had been formed, was arranged in alignment on the frame plate (51) through the spacer (70), thereby forming a molding material layer in a molding cavity between the top force (60) and the bottom force (65).

Electromagnets were arranged on an upper surface of the ferromagnetic base plate (61) of the top force (60) and a lower surface of the ferromagnetic base plate (66) of the bottom force (65), and the electromagnets are operated, whereby a magnetic field of 1.3 T was applied to the molding material layer in a thickness-wise direction thereof at portions located between the ferromagnetic substance layers (62) of the top force (60) and the ferromagnetic substance layers (67) of the bottom force (65). In this state, the molding material layer was subjected to a curing treatment under conditions of 100° C. for 1 hour, thereby forming an elastic anisotropically conductive film in the frame plate (51) to produce a comparative anisotropically conductive connector (50).

In a functional part (56) of the elastic anisotropically conductive film (55) in the anisotropically conductive connector (50) thus obtained, 16 (4×4) conductive parts (57) for connection are formed, and a center distance (pitch) between adjacent conductive parts (57) for connection is 1 mm. Each of the conductive parts (57) for connection is such that the diameter is 300 μm, the thickness is 400 μm, and the projected heights from both surfaces of the insulating part (58) are each 50 μm. The thickness of the insulating part (58) is 300 μm.

The proportion of the conductive particles in the conductive parts (57) for connection was 25% in terms of a volume fraction.

[Evaluation of Anisotropically Conductive Connector]

The circuit board for inspection produced in Example 1 was used to evaluate the anisotropically conductive connector described above in the same manner as in Example 1 except that the conditions were changed to conditions that neither the frame plate of the anisotropically conductive connector nor the grounding electrode of the circuit board for inspection was connected to a ground. The results are shown in the following Table 1.

|  |  | Test Frequency(GHz) | | | | | | | |
| --- | --- | --- | --- | --- | --- | --- | --- | --- | --- |
|  |  | 0.1 | 0.2 | 0.5 | 1 | 2 | 5 | 10 | 20 |
| Example 1 | Condition1 | A | A | A | A | A | B | C | C |
|  | Condition2 | A | A | A | A | A | A | A | B |
|  | Condition3 | A | A | A | A | A | A | A | A |
| Comparative Example 1 |  | A | A | A | B | C | C | C | C |

The invention claimed is:

1. An anisotropically conductive connector comprising an elastic anisotropically conductive film, comprising:

a plurality of conductive parts for connection arranged in a pattern corresponding to a pattern of electrodes to be connected and extending in a thickness-wise direction of the film;

an insulating part mutually insulating the plurality of conductive parts for connection; and a plurality of cylindrical conductive parts for high-frequency shielding arranged to surround each of the conductive parts for connection and extending in the thickness-wise direction in the elastic anisotropically conductive film, wherein the elastic anisotropically conductive film is composed of an elastic polymeric substance, in each of the conductive parts for connection and each of the conductive parts for high-frequency shielding, conductive particles are contained in the elastic polymeric substance in a state oriented so as to align in the thickness-wise direction of the film, and the insulating part is substantially free of conductive particles.

2. An anisotropically conductive connector comprising an elastic anisotropically conductive film, comprising:

a plurality of conductive parts for connection arranged in a pattern corresponding to a pattern of electrodes to be connected and extending in a thickness-wise direction of the film;

an insulating part mutually insulating the plurality of conductive parts for connection; and a cylindrical conductive part for high-frequency shielding arranged to surround a group of conductive parts in the plurality of the conductive parts for connection and extending in the thickness-wise direction in the elastic anisotropically conductive film, wherein the elastic anisotropically conductive film is composed of an elastic polymeric substance;

in each of the conductive parts for connection and each of the conductive parts for high-frequency shielding, conductive particles are contained in the elastic polymeric substance in a state oriented so as to align in the thickness-wise direction of the film, and the insulating part is substantially free of conductive particles.

3. An anisotropically conductive connector comprising:

a frame plate having conductivity and a plurality of openings in a pattern corresponding to a pattern of electrodes to be connected; and an elastic anisotropically conductive film composed of a plurality of functional parts arranged in the respective openings of the frame plate and composed of a conductive part for connection extending in a thickness-wise direction of the film and an insulating part formed integrally with the periphery of the conductive part, and a part to be supported, which is formed integrally with the peripheries of the functional parts and fixed to the frame plate by being laminated on the frame plate, wherein a plurality of cylindrical conductive parts for high-frequency shielding are arranged to surround each of the conductive parts for connection, electrically connected to the frame plate and extending in the thickness-wise direction in the part to be supported in the elastic anisotropically conductive film, wherein the elastic anisotropically conductive film is composed of an elastic polymeric substance;

in each of the conductive parts for connection and each of the conductive parts for high-frequency shielding, conductive particles are contained in the elastic polymeric substance in a state oriented so as to align in the thickness-wise direction of the film, and the insulating part is substantially free of conductive particles.

4. An anisotropically conductive connector comprising:

a frame plate having conductivity and an opening extending through in a thickness-wise direction; and an elastic anisotropically conductive film arranged in the opening of the frame plate and composed of a functional part having a plurality of conductive parts for connection arranged in a pattern corresponding to a pattern of electrodes to be connected and extending in the thickness-wise direction and an insulating part mutually insulating the conductive parts for connection, and a part to be supported, which is formed integrally with the periphery of the functional part and fixed to the frame plate by being laminated on the frame plate, wherein a cylindrical conductive part for high-frequency shielding is arranged to surround a group of conductive parts in the plurality of the conductive parts for connection, electrically connected to the frame plate and extending in the thickness-wise direction in the part to be supported in the elastic anisotropically conductive film, wherein the elastic anisotropically conductive film is composed of an elastic polymeric substance;

in each of the conductive parts for connection and each of the conductive parts for high-frequency shielding, conductive particles are contained in the elastic polymeric substance in a state oriented so as to align in the thickness-wise direction of the film, and the insulating part is substantially free of conductive particles.

5. An anisotropically conductive connector comprising:

a frame plate having conductivity and a plurality of openings in a pattern corresponding to a pattern of electrodes to be connected; and an elastic anisotropically conductive film composed of a plurality of functional parts arranged in the respective openings of the frame plate and composed of a conductive part for connection extending in a thickness wise direction of the film and an insulating part formed integrally with the periphery of the conductive part, and a part to be supported, which is formed integrally with the peripheries of the functional parts and fixed to the frame plate by being laminated on the frame plate, wherein a cylindrical conductive part for high-frequency shielding is arranged to surround a group of conductive parts in the plurality of the conductive parts for connection, electrically connected to the frame plate and extending in the thickness-wise direction in the part to be supported in the elastic anisotropically conductive film, wherein the elastic anisotropically conductive film is composed of an elastic polymeric substance;

in each of the conductive parts for connection and each of the conductive parts for high-frequency shielding, conductive particles are contained in the elastic polymeric substance in a state oriented so as to align in the thickness-wise direction of the film, and the insulating part is substantially free of conductive particles.

6. The anisotropically conductive connector according to any one of claims 1 or 3, wherein each cylindrical conductive part for high-frequency shielding is arranged concentrically with a respective conductive part for connection to surround the respective conductive part for connection.

7. The anisotropically conductive connector according to claim 4, wherein one or more conductive parts for non-connection are formed in addition to the conductive parts for connection in the elastic anisotropically conductive film, and the conductive parts for high-frequency shielding are arranged so as to surround a group of conductive parts including the plurality of the conductive parts for connection and one or more conductive parts for non-connection.

8. The anisotropically conductive connector according to any one of claims 1 or 2, wherein the conductive parts for high-frequency shielding are connected to a ground.

9. The anisotropically conductive connector according to any one of claims 3 or 5, wherein the frame plate is connected to a ground.

10. An electrical inspection apparatus for circuit devices, which comprises the anisotropically conductive connector according to any one of claims 1, 2, 3, 4, 5, or 7.

11. An electrical inspection apparatus for circuit devices, which comprises a circuit board for inspection, on which inspection electrodes have been formed in a pattern corresponding to a pattern of electrodes to be inspected of a circuit device, which is an object of inspection, and the anisotropically conductive connector according to claim 8, which is arranged on the circuit board for inspection,
    wherein in the circuit board for inspection, grounding electrodes connected to a ground are formed in a pattern corresponding to a pattern of the conductive parts for high-frequency shielding in the anisotropically conductive connector.

12. An electrical inspection apparatus for circuit devices, which comprises a circuit board for inspection, on which inspection electrodes have been formed in a pattern corresponding to a pattern of electrodes to be inspected of a circuit device, which is an object of inspection, and the anisotropically conductive connector according to claim 9, which is arranged on the circuit board for inspection,
    wherein the frame plate in the anisotropically conductive connector is connected to a ground.

13. An electrical inspection apparatus for circuit devices, which comprises the anisotropically conductive connector according to claim 8.

14. An electrical inspection apparatus for circuit devices, which comprises the anisotropically conductive connector according to claim 9.

* * * * *